US012763151B2

(12) United States Patent
Chen et al.

(10) Patent No.: US 12,763,151 B2
(45) Date of Patent: Oct. 13, 2026

(54) VARIABLE FAST LOOK NEIGHBOR AHEAD TO IMPROVE READ ACCURACY

(71) Applicant: Sandisk Technologies, Inc., Milpitas, CA (US)

(72) Inventors: Albert Chen, Milpitas, CA (US); Xiang Yang, Santa Clara, CA (US); Jiahui Yuan, Fremont, CA (US); Eric Fu, Sunnyvale, CA (US)

(73) Assignee: Sandisk Technologies, inc., Milpitas, CA (US)

( * ) Notice: Subject to any disclaimer, the term of this patent is extended or adjusted under 35 U.S.C. 154(b) by 28 days.

(21) Appl. No.: 18/735,803

(22) Filed: Jun. 6, 2024

(65) Prior Publication Data

US 2025/0378885 A1 Dec. 11, 2025

(51) Int. Cl.

| | |
|---|---|
| ***G11C 16/26*** | (2006.01) |
| ***G11C 16/04*** | (2006.01) |
| ***H10B 41/10*** | (2023.01) |
| ***H10B 41/27*** | (2023.01) |
| ***H10B 41/35*** | (2023.01) |
| ***H10B 43/10*** | (2023.01) |
| ***H10B 43/27*** | (2023.01) |
| ***H10B 43/35*** | (2023.01) |

(52) U.S. Cl.

CPC .......... *G11C 16/26* (2013.01); *G11C 16/0483* (2013.01); *H10B 41/10* (2023.02); *H10B 41/27* (2023.02); *H10B 41/35* (2023.02); *H10B 43/10* (2023.02); *H10B 43/27* (2023.02); *H10B 43/35* (2023.02)

(58) Field of Classification Search

CPC .... G11C 16/26; G11C 16/0483; H10B 41/10; H10B 41/27; H10B 41/35; H10B 43/10; H10B 43/27; H10B 43/35

See application file for complete search history.

(56) References Cited

U.S. PATENT DOCUMENTS

| | | | |
|---|---|---|---|
| 9,530,512 | B2 | 12/2016 | Ray et al. |
| 9,672,940 | B1 * | 6/2017 | Reusswig ........... G11C 11/5628 |
| 9,721,652 | B2 | 8/2017 | Puthenthermadam et al. |
| 11,024,393 | B1 | 6/2021 | Zhang et al. |
| 11,139,031 | B1 * | 10/2021 | Chen ................... G11C 11/5642 |
| 11,264,105 | B2 | 3/2022 | Yamabe et al. |
| 11,342,033 | B1 * | 5/2022 | Song ...................... G11C 16/32 |
| 11,887,670 | B2 | 1/2024 | Lien et al. |
| 2021/0407605 | A1 | 12/2021 | Lien et al. |
| 2024/0272796 | A1 * | 8/2024 | Jia ......................... G06F 3/0659 |

* cited by examiner

*Primary Examiner* — Amir Zarabian
*Assistant Examiner* — Bradley S Coon
(74) *Attorney, Agent, or Firm* — Dickinson Wright PLLC

(57) ABSTRACT

A memory apparatus includes memory cells connected to word lines and configured to retain a threshold voltage corresponding to data states. A control means is configured to determine ones of the data states for the memory cells of a neighboring word line adjacent to a selected word line in a pre-read. The control means determines an adjusted sense time according to a zone identified for the memory cells of the neighboring word line and the one of the data states targeted for the memory cells of the selected word line and a temperature of the memory apparatus. The control means is also configured to perform reads on the selected word line for each of a plurality of groupings of ones of the data states in a read operation using the adjusted sense time determined for each of the memory cells of the selected word line.

17 Claims, 32 Drawing Sheets

| | | DSEN2_X_ZONE | | TCO_DSEN2_ZONE | |
|---|---|---|---|---|---|
| PAGE | READ LEVEL | ZONE 1 | ZONE 2 | ZONE 1 | ZONE 2 |
| LP | ER | -0.15 µs | -0.15 µs | 0.06 | 0.015 |
| | AR | -0.17µs | -0.18 µs | 0.06 | 0.04 |
| MP | FR | -0.15 µs | -0.15 µs | 0.05 | 0.01 |
| | DR | -0.15 µs | -0.15 µs | 0.05 | 0.02 |
| | BR | -0.17 µs | -0.17 µs | 0.06 | 0.03 |
| UP | GR | -0.15 µs | -0.15 µs | 0.06 | 0.005 |
| | CR | -0.17 µs | -0.18 µs | 0.06 | 0.025 |

DSEN2_X_ZONE1 (NEW)= DSEN2_X_ZONE1 · (1+ TCO_DSEN2_ZONE1 · (T – 85))

DSEN2_X_ZONE2 (NEW)= DSEN2_X_ZONE2 · (1+ TCO_DSEN2_ZONE2 · (T – 85))

| | | DSEN2_X_ZONE | | TCO_DSEN2_ZONE | |
|---|---|---|---|---|---|
| PAGE | READ LEVEL | ZONE 1 | ZONE 2 | ZONE 1 | ZONE 2 |
| LP | ER | -0.15 µs | -0.15 µs | 0.05 | 0.015 |
| | AR | -0.17µs | -0.18 µs | 0.06 | 0.04 |
| MP | FR | -0.15 µs | -0.15 µs | 0.05 | 0.01 |
| | DR | -0.15 µs | -0.15 µs | 0.05 | 0.02 |
| | BR | -0.17 µs | -0.17 µs | 0.06 | 0.03 |
| UP | GR | -0.15 µs | -0.15 µs | 0.05 | 0.005 |
| | CR | -0.17 µs | -0.16 µs | 0.06 | 0.025 |

DSEN2_X_ZONE1 (NEW)= DSEN2_X_ZONE1 · (1+ TCO_DSEN2_ZONE1 · (T − 85))

DSEN2_X_ZONE2 (NEW)= DSEN2_X_ZONE2 · (1+ TCO_DSEN2_ZONE2 · (T − 85))

FIG. 28

VARIABLE FAST LOOK NEIGHBOR AHEAD TO IMPROVE READ ACCURACY

FIELD

This application relates to non-volatile memory apparatuses and the operation of non-volatile memory apparatuses.

BACKGROUND

This section provides background information related to the technology associated with the present disclosure and, as such, is not necessarily prior art.

Semiconductor memory apparatuses have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory apparatuses to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

SUMMARY

This section provides a general summary of the present disclosure and is not a comprehensive disclosure of its full scope or all of its features and advantages.

An object of the present disclosure is to provide a memory apparatus and a method of operating the memory apparatus that address and overcome the shortcomings described herein.

Accordingly, it is an aspect of the present disclosure to provide a memory apparatus including memory cells each connected to one of a plurality of word lines and configured to retain a threshold voltage corresponding to one of a plurality of data states. The memory apparatus also includes a control means configured to determine ones of the plurality of data states for the memory cells of a neighboring word line of the plurality of word lines adjacent to a selected word line of the plurality of word lines in a pre-read. The control means determines an adjusted sense time according to a zone of a plurality of zones identified for the memory cells of the neighboring word line adjacent each of the memory cells of the selected word line and the one of the plurality of data states targeted for the memory cells of the selected word line and a temperature of the memory apparatus. The control means is also configured to perform a plurality of reads on the selected word line for each of a plurality of groupings of ones of the plurality of data states in a read operation using the adjusted sense time determined for each of the memory cells of the selected word line.

According to another aspect of the disclosure, a controller in communication with a memory apparatus including memory cells each connected to one of a plurality of word lines is also provided. The memory cells are configured to retain a threshold voltage corresponding to one of a plurality of data states. The controller is configured to instruct the memory apparatus to determine ones of the plurality of data states for the memory cells of a neighboring word line of the plurality of word lines adjacent to a selected word line of the plurality of word lines in a pre-read. The controller is further configured to instruct the memory apparatus to determine an adjusted sense time according to a zone of a plurality of zones identified for the memory cells of the neighboring word line adjacent each of the memory cells of the selected word line and the one of the plurality of data states targeted for the memory cells of the selected word line and a temperature of the memory apparatus. The controller is also configured to instruct the memory apparatus to perform a plurality of reads on the selected word line for each of a plurality of groupings of ones of the plurality of data states in a read operation using the adjusted sense time determined for each of the memory cells of the selected word line.

According to an additional aspect of the disclosure a method of operating a memory apparatus is provided. The memory apparatus includes memory cells each connected to one of a plurality of word lines. The memory cells are configured to retain a threshold voltage corresponding to one of a plurality of data states. The method includes the step of determining ones of the plurality of data states for the memory cells of a neighboring word line of the plurality of word lines adjacent to a selected word line of the plurality of word lines in a pre-read. The method continues with the step of determining an adjusted sense time according to a zone of a plurality of zones identified for the memory cells of the neighboring word line adjacent each of the memory cells of the selected word line and the one of the plurality of data states targeted for the memory cells of the selected word line and a temperature of the memory apparatus. The method also includes the step of performing a plurality of reads on the selected word line for each of a plurality of groupings of ones of the plurality of data states in a read operation using the adjusted sense time determined for each of the memory cells of the selected word line.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Figure 12B:
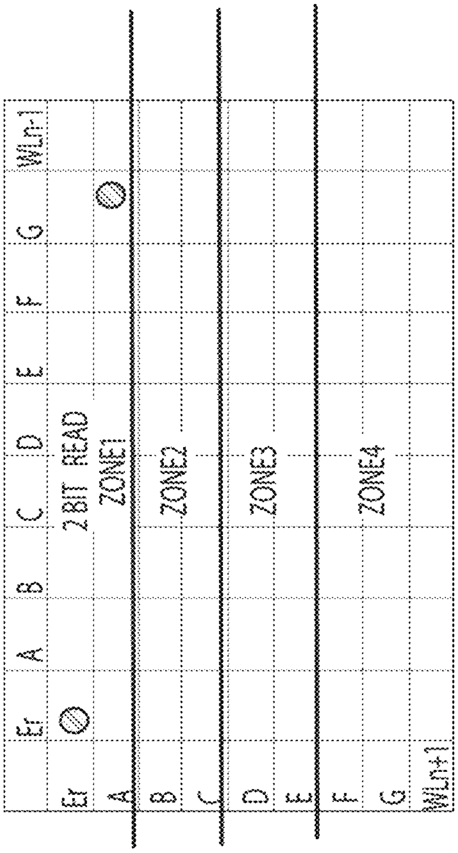
Figure 12A:
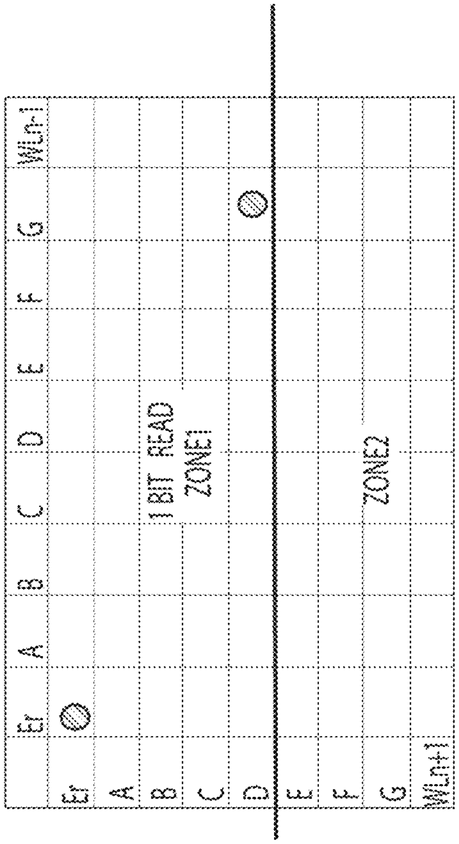
Figure 13B:
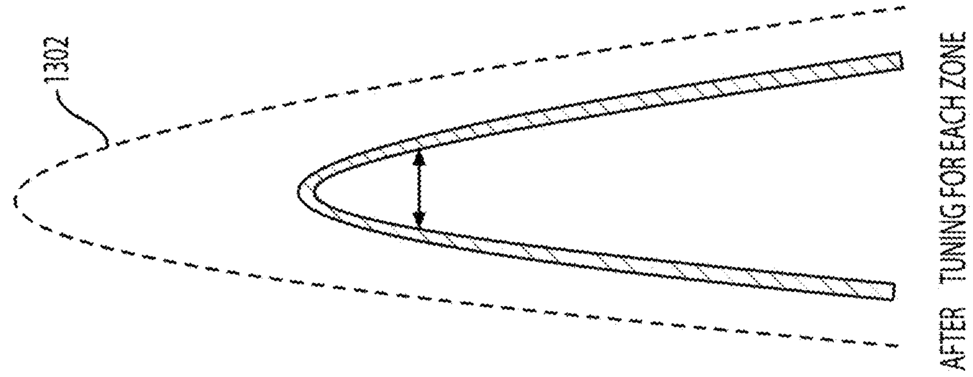
Figure 13A:
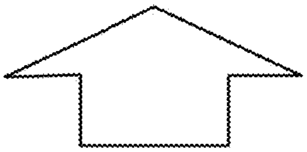
Figure 13A:
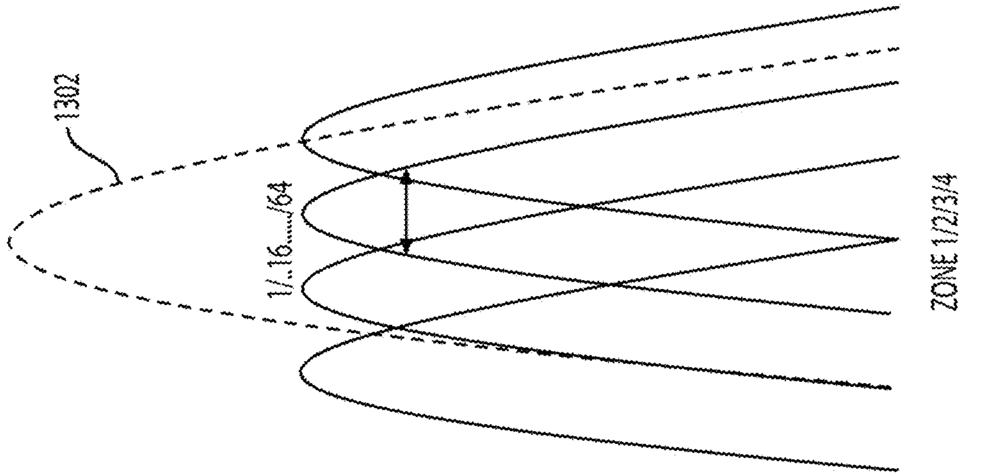
Figure 14:
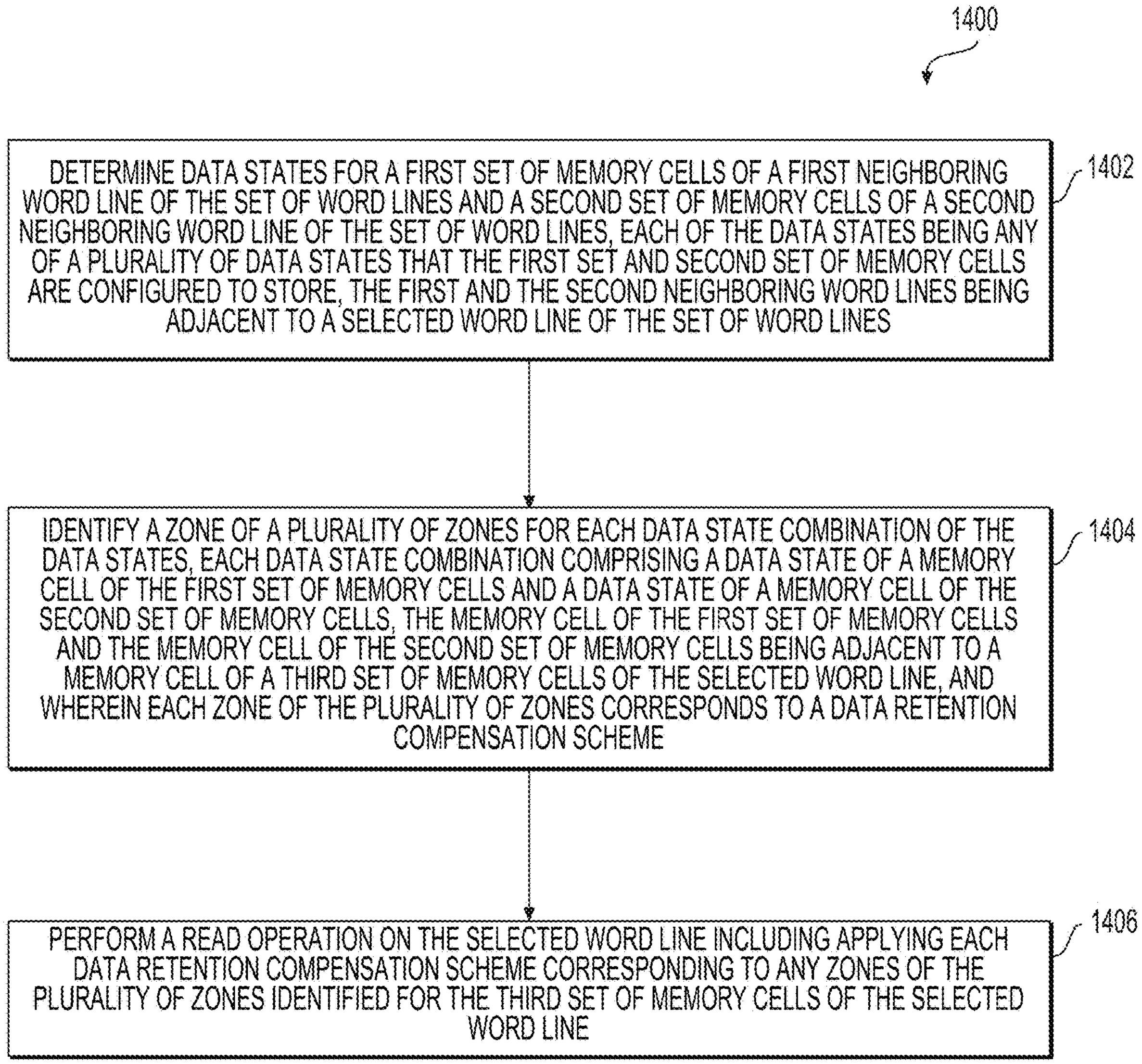
Figure 19:
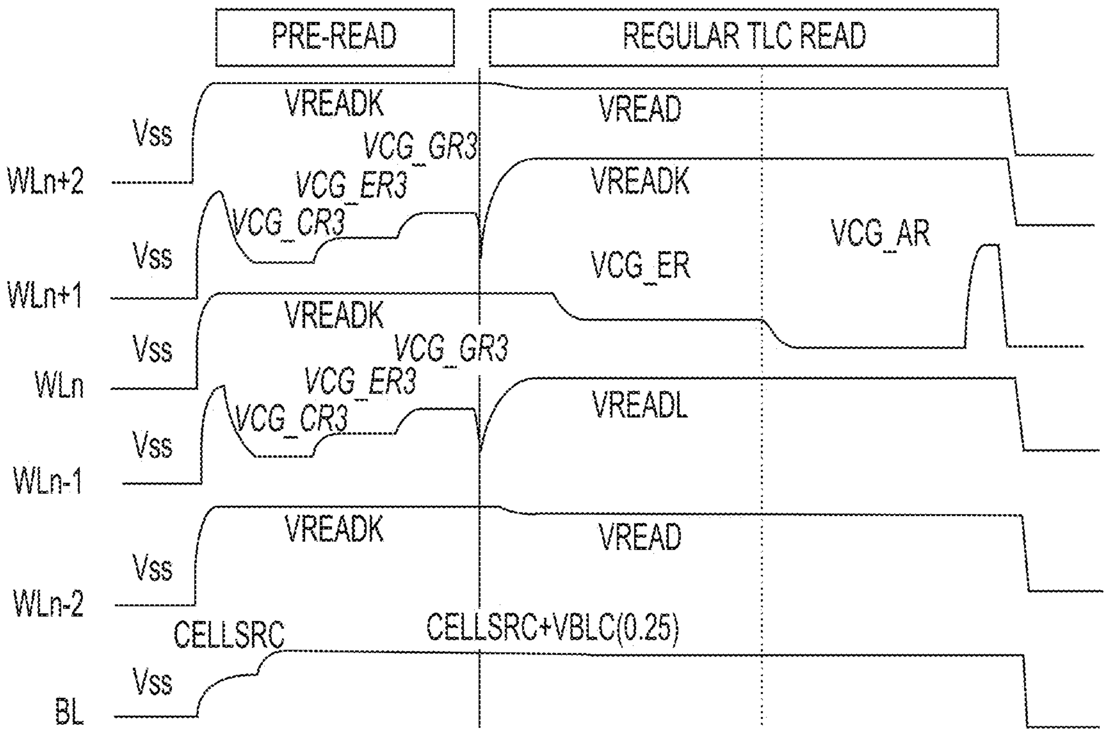
Figure 20:
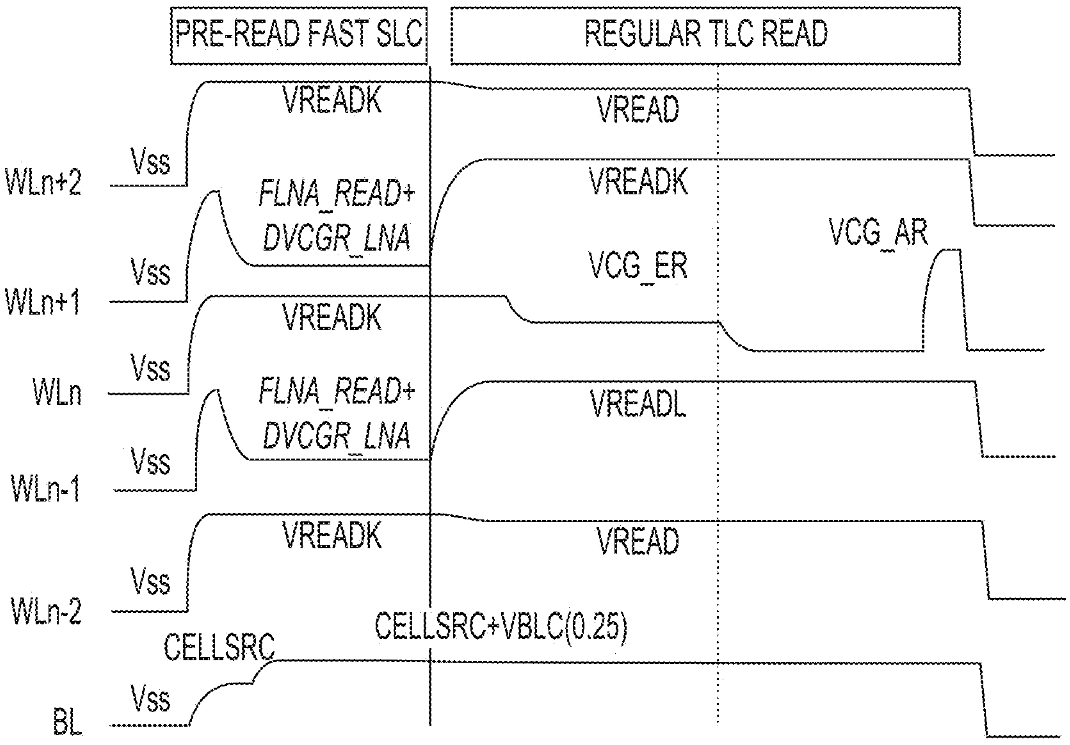
Figure 21:
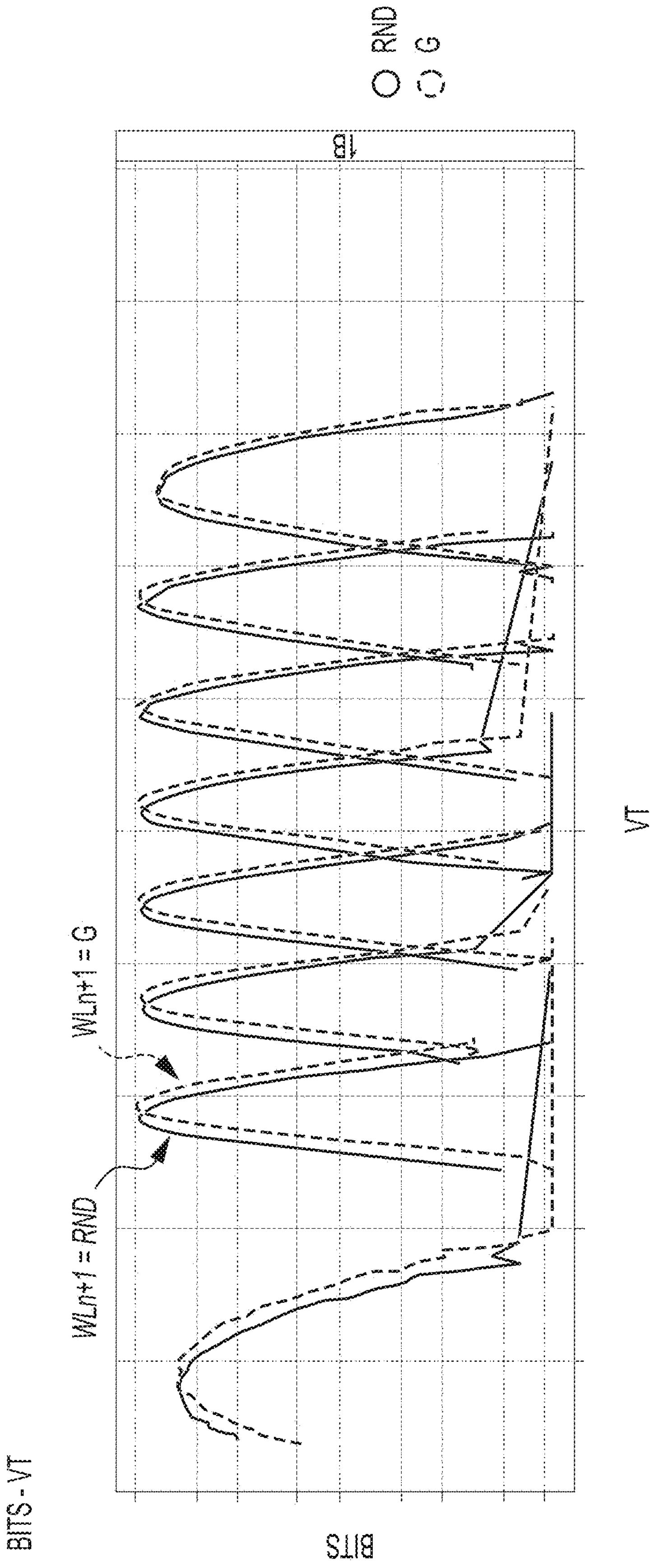
Figure 23:
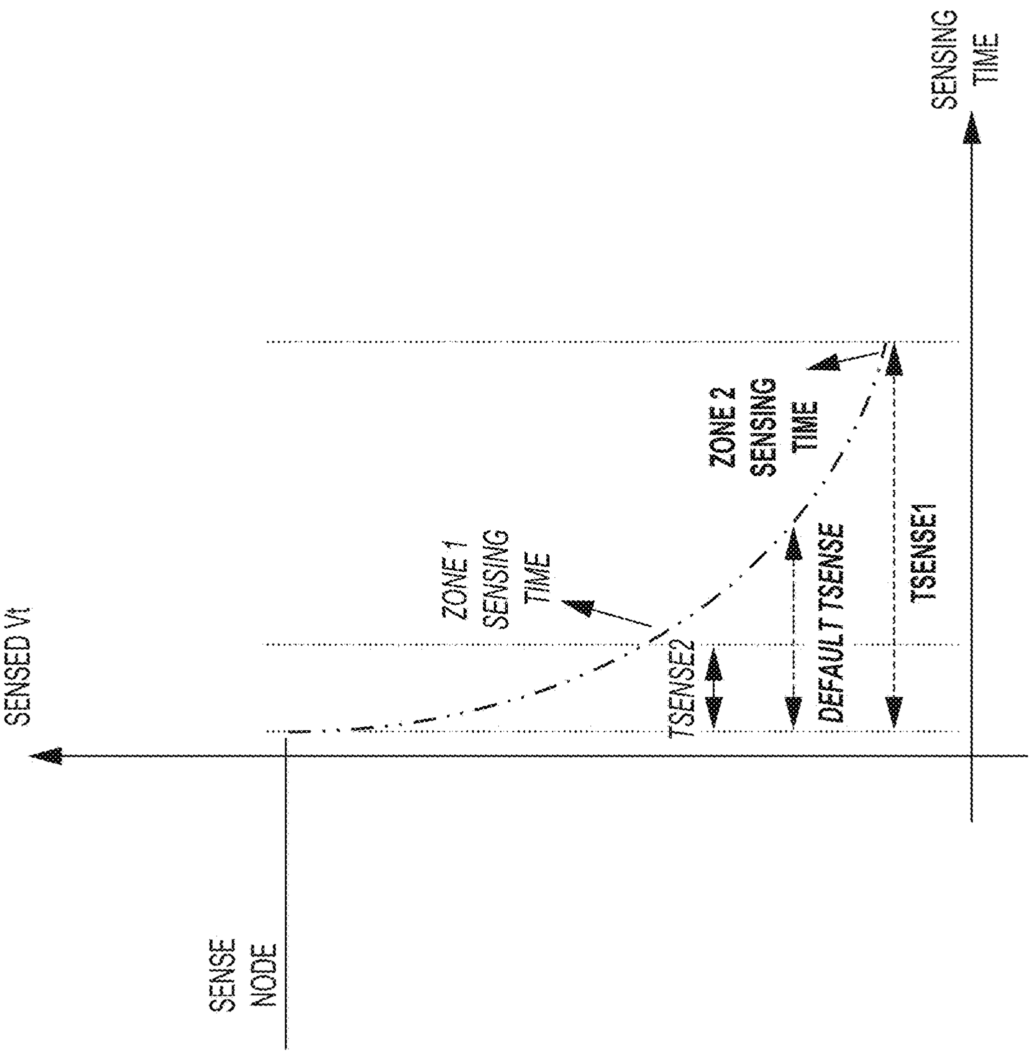
Figure 22:
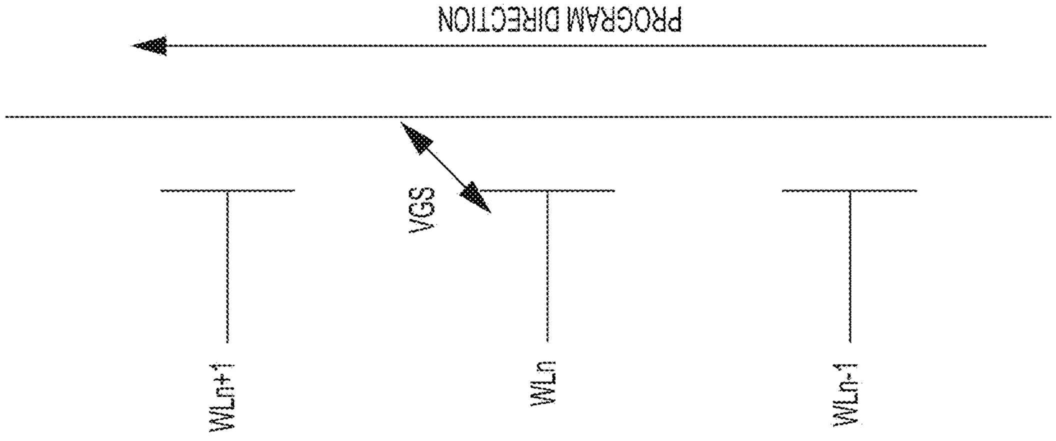
Figure 24:
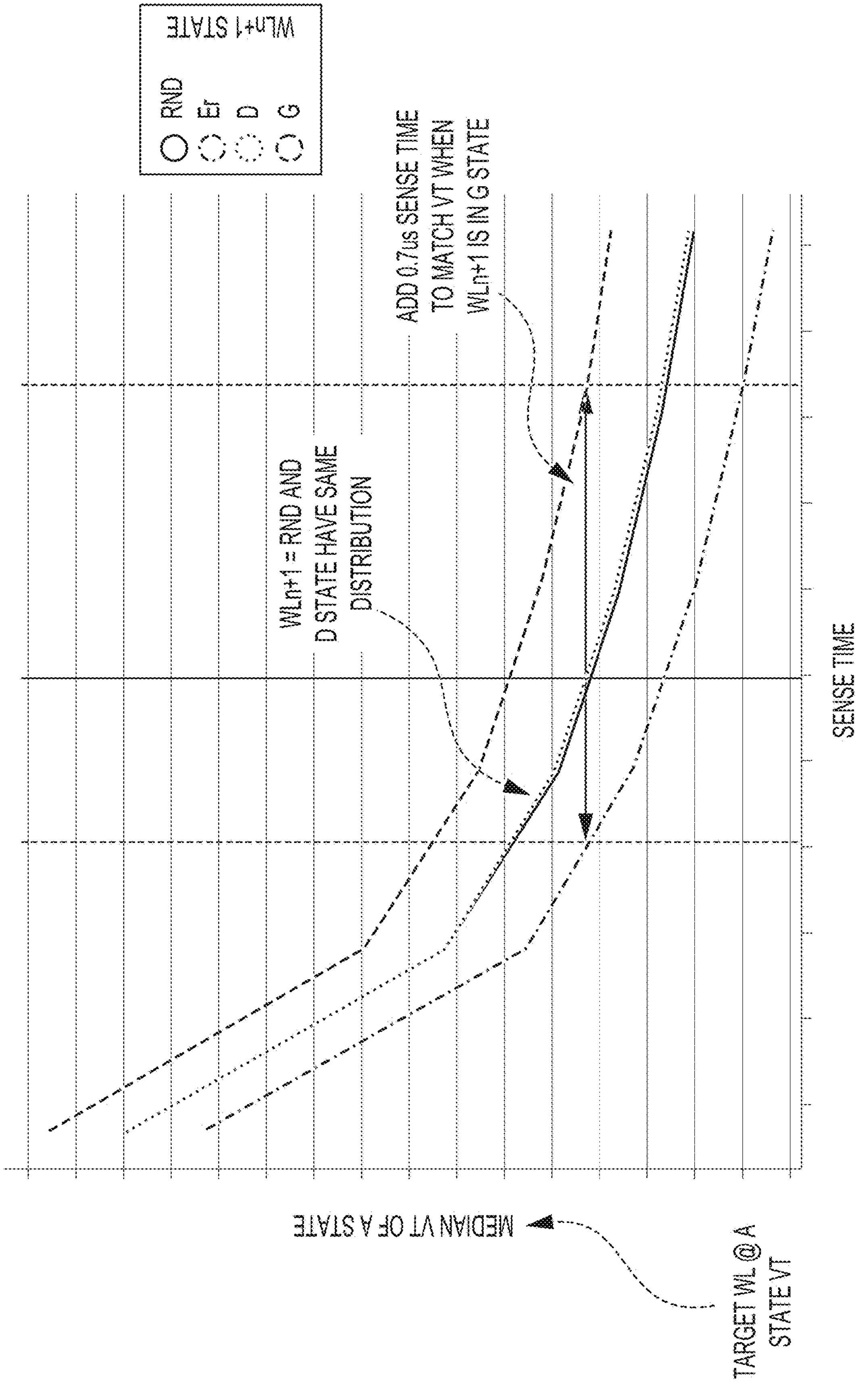
Figure 25:
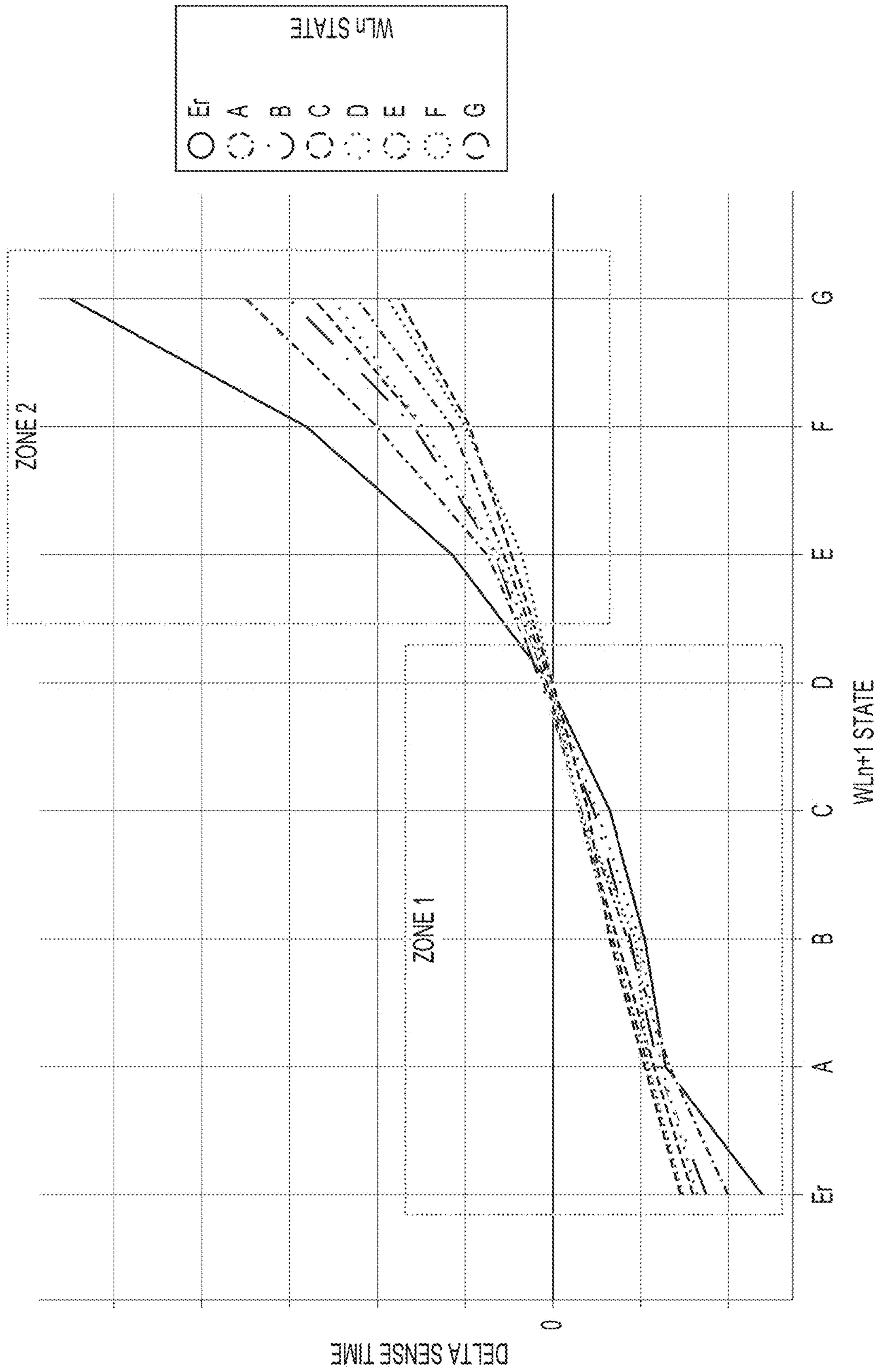
Figure 26A:
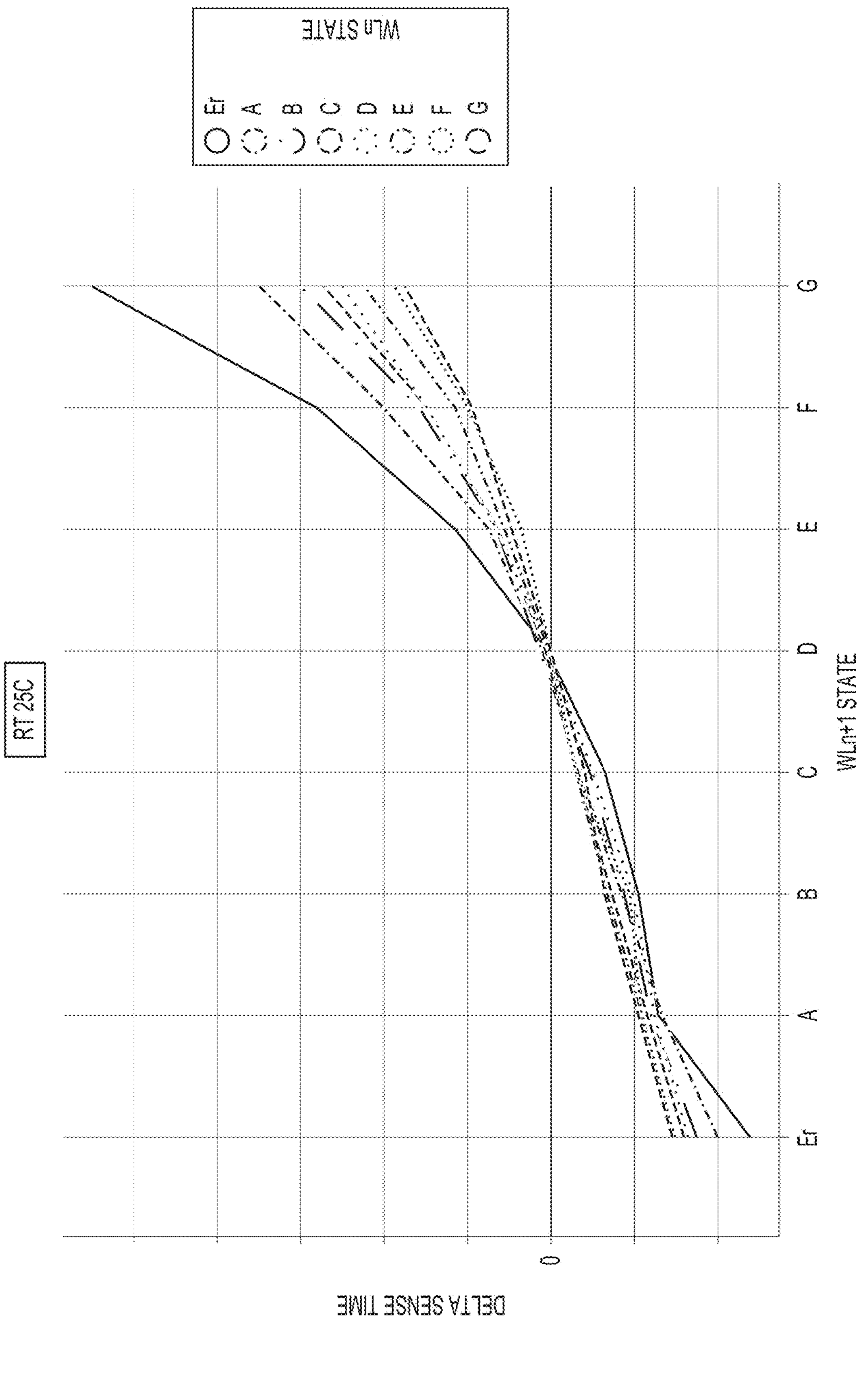
Figure 26B:
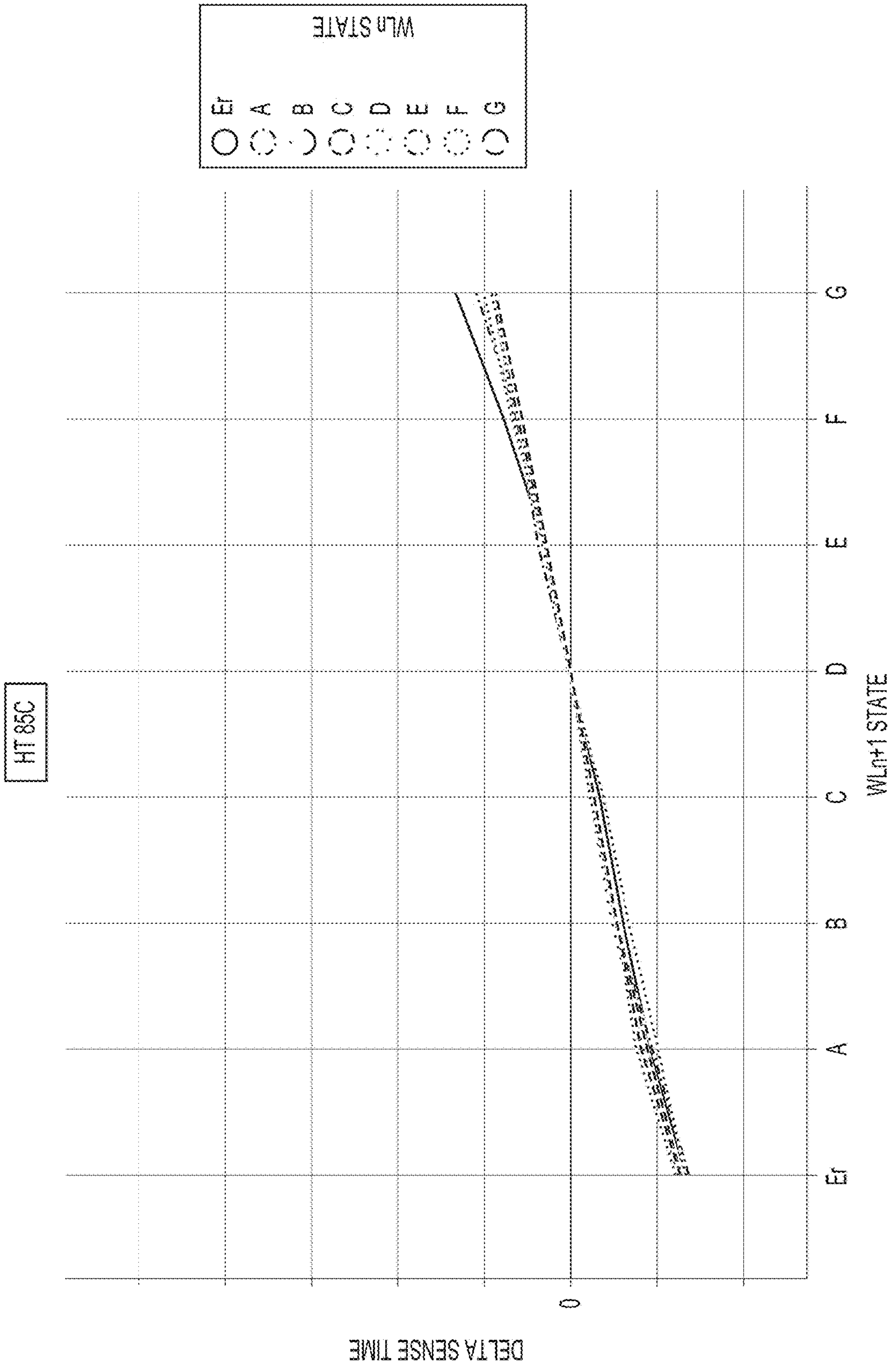
Figure 27:
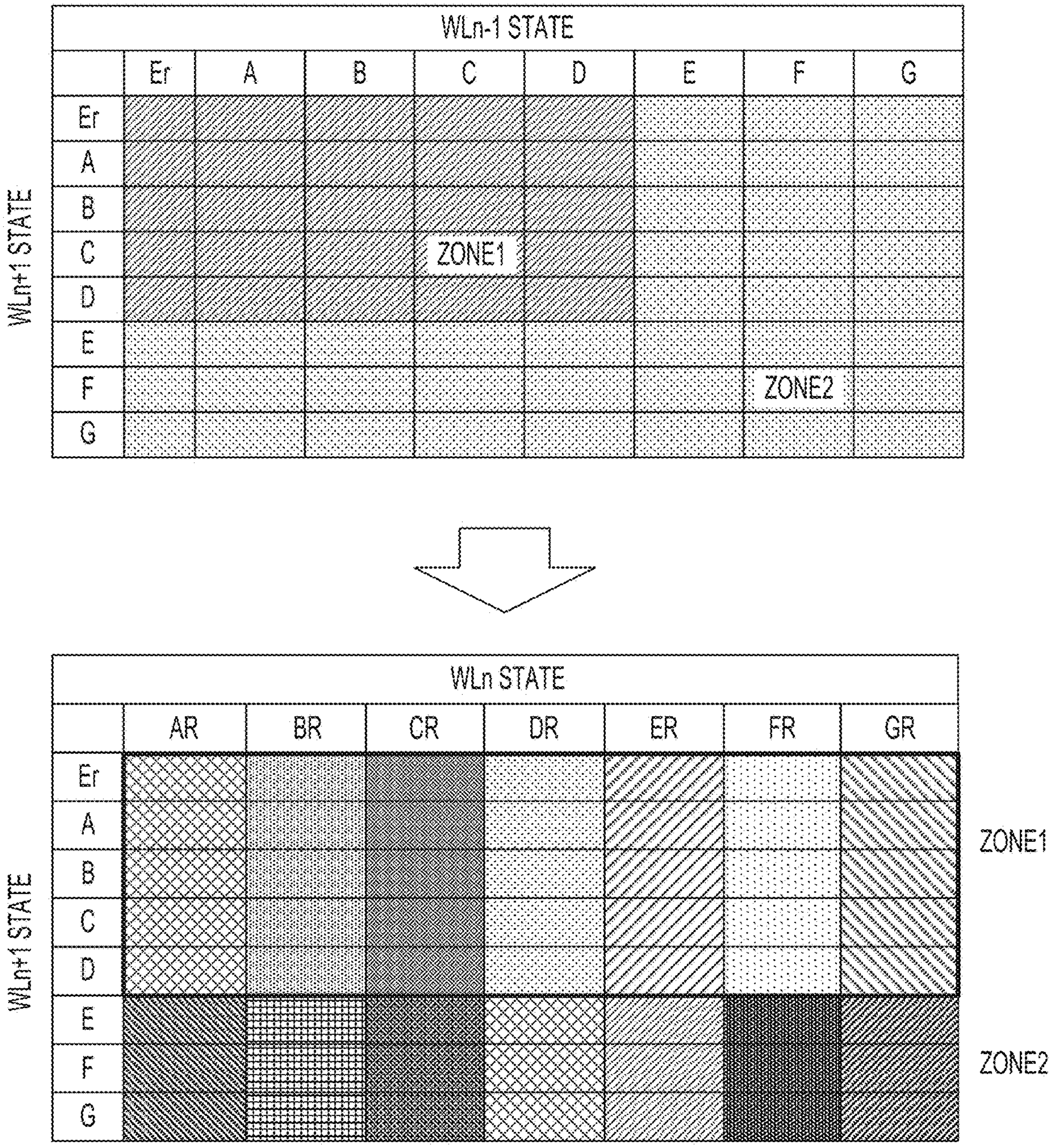
Figure 29:
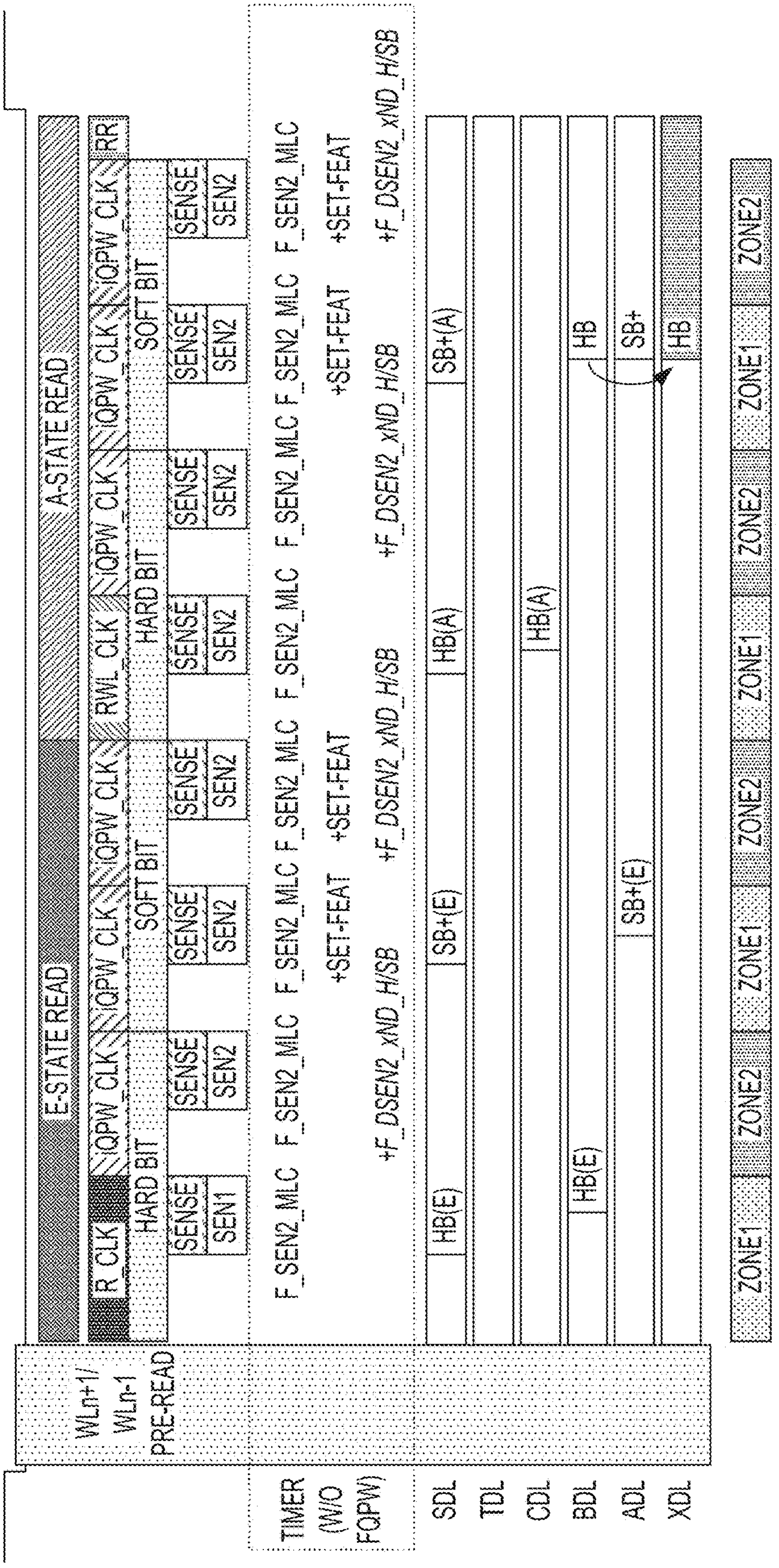
Figure 30:
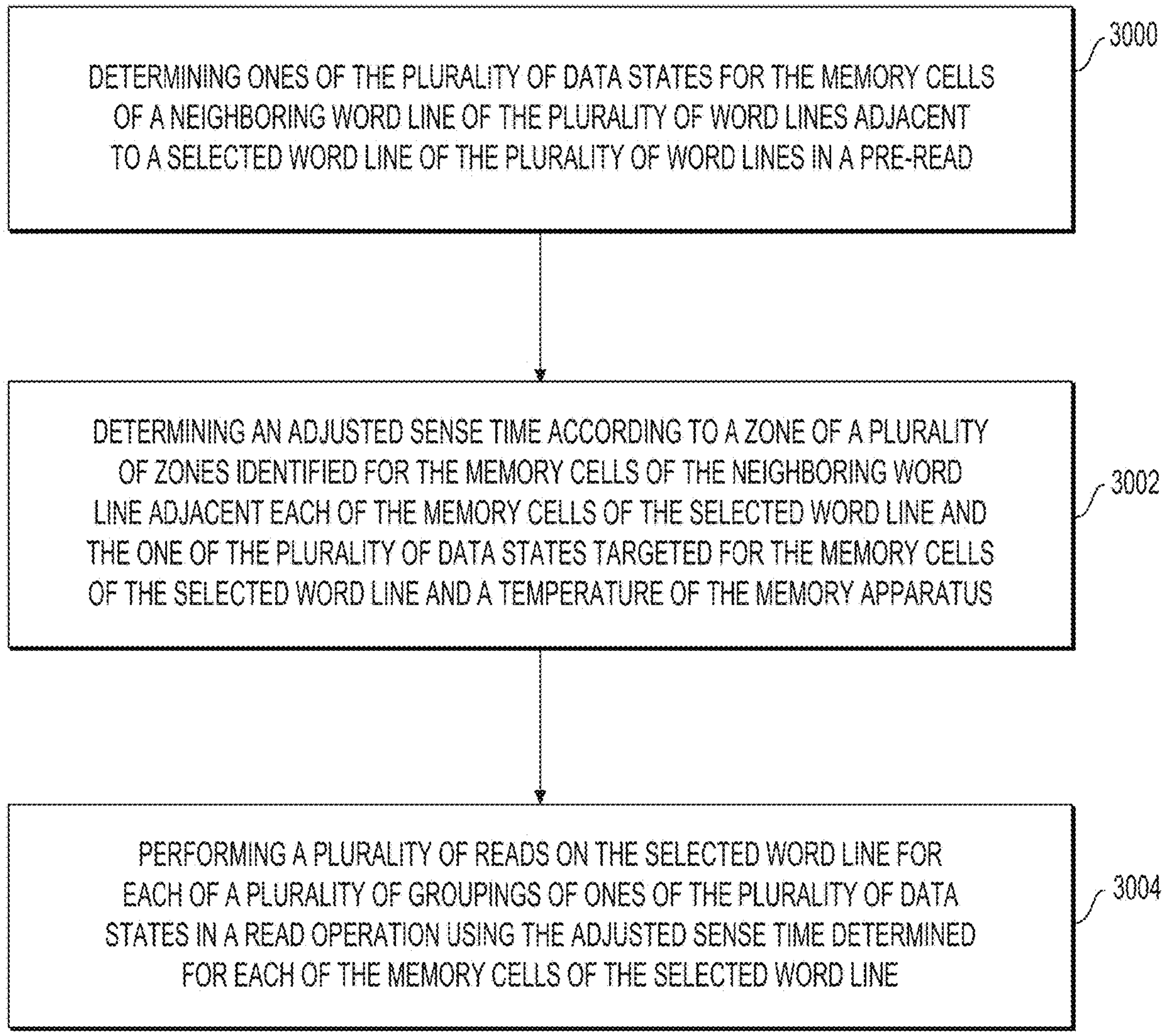

FIGS. 12A and 12B provide exemplary representations of zones identified for a one-bit and a two-bit read according to aspects of the disclosure;

FIGS. 13A and 13B illustrates example graphical representations of an overall Vth distribution and four zones identified within the overall Vth distribution according to aspects of the disclosure;

FIG. 14 is a flowchart of a method for performing a look neighbor ahead pre-read according to aspects of the disclosure;

FIGS. 15-18 provide an exemplary table of zone mappings to data state combinations according to aspects of the disclosure;

FIG. 19 shows a read operation in which a first neighboring word line is read before each page according to aspects of the disclosure;

FIG. 20 shows a read operation in which the first neighboring word line and second neighboring word line are read before each page according to aspects of the disclosure;

FIG. 21 is a plot of threshold voltage distributions when not using look neighbor ahead when the memory cell of the first neighboring word line is randomly programmed as compared to programmed to the G data state according to aspects of the disclosure;

FIG. 22 shows a selected memory cell along with neighboring memory cells connected to neighboring word lines and illustrates a programming order or direction according to aspects of the disclosure;

FIG. 23 is a plot of a threshold voltage detected versus the sense time according to aspects of the disclosure;

FIG. 24 is a plot of a median threshold voltage of memory cells in the A data state versus the sense time when the memory cell of the first neighboring word line is programmed randomly, erased, in the D data state, and the G data state according to aspects of the disclosure;

FIG. 25 illustrates a delta sense time dependence on the data states of the first neighboring word line and the selected word line according to aspects of the disclosure;

FIGS. 26A and 26B illustrate the delta sense time dependence on the data states of the first neighboring word line and the selected word line at two different temperatures according to aspects of the disclosure;

FIG. 27 shows a comparison of zone sensing in a look neighbor ahead approach utilizing data states of both the first neighboring word line and the second neighboring word line to define the zones to the look neighbor ahead approach described herein utilizing data states of selected word line and the first neighboring word line define the zones according to aspects of the disclosure;

FIG. 28 shows an example coefficient look up table along with equations used to calculate a first zone delta sense time and a second zone delta sense time according to aspects of the disclosure;

FIG. 29 shows example timing for read operations including the pre-read according to aspects of the disclosure; and FIG. 30 illustrates steps of a method of operating a memory apparatus according to aspects of the disclosure.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following description, details are set forth to provide an understanding of the present disclosure. In some instances, certain circuits, structures and techniques have not been described or shown in detail in order not to obscure the disclosure.

In general, the present disclosure relates to non-volatile memory apparatuses of the type well-suited for use in many applications. The non-volatile memory apparatus and associated methods of operation of this disclosure will be described in conjunction with one or more example embodiments. However, the specific example embodiments disclosed are merely provided to describe the inventive concepts, features, advantages and objectives with sufficient clarity to permit those skilled in this art to understand and practice the disclosure. Specifically, the example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

A programming operation for a set of memory cells of a memory device typically involves applying a series of program voltages to the memory cells after the memory cells are provided in an erased state. Each program voltage is provided in a program loop, also referred to as a program-verify iteration. For example, the program voltage may be applied to a word line which is connected to control gates of the memory cells. In one approach, incremental step pulse programming is performed, where the program voltage is increased by a step size in each program loop. Verify operations may be performed after each program voltage to determine whether the memory cells have completed programming. When programming is completed for a memory cell, it can be locked out from further programming while programming continues for other memory cells in subsequent program loops.

Figure 9:
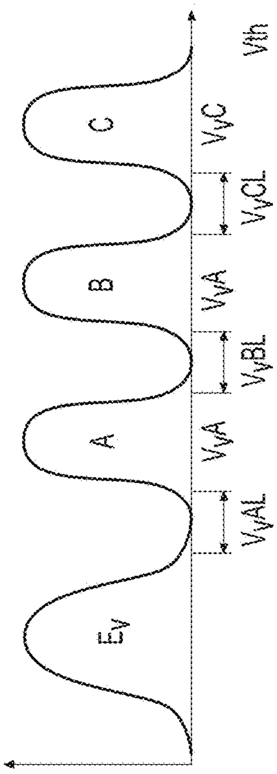
FIG. 9 depicts the Vth distributions of memory cells in an example one-pass programming operation with four data states according to aspects of the disclosure.
Figure 10:
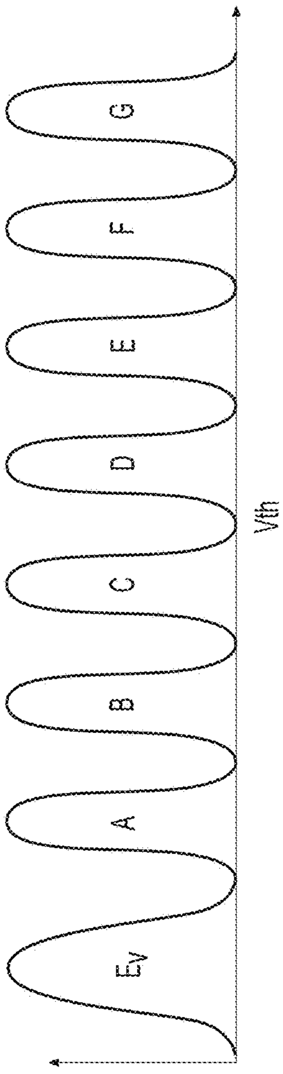
FIG. 10 depicts the Vth distributions of memory cells in an example one-pass programming operation with eight data states according to aspects of the disclosure.
Figure 11:
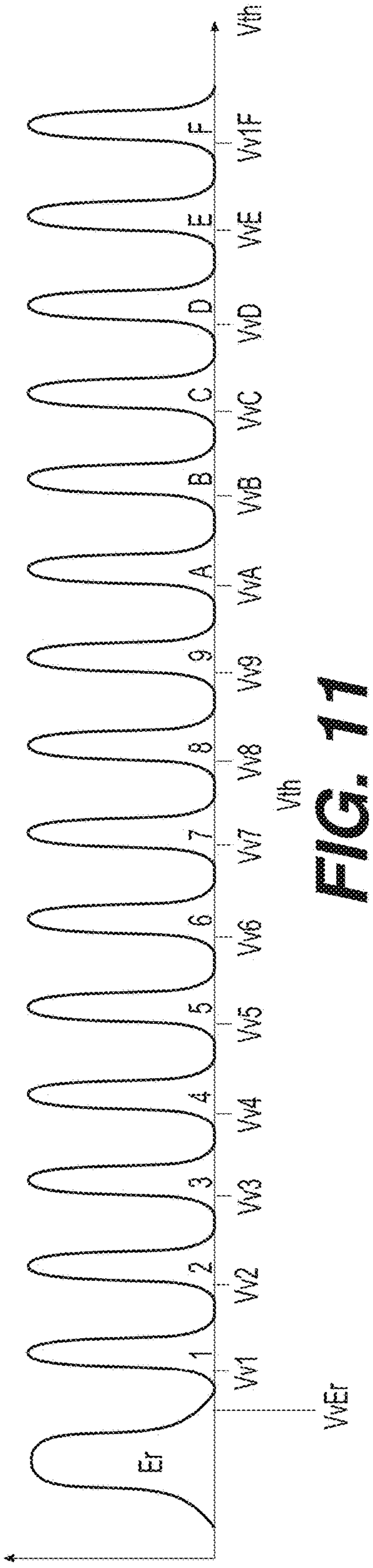
FIG. 11 depicts the Vth distributions of memory cells in an example one-pass programming operation with eight data states according to aspects of the disclosure.

Each memory cell may be associated with a data state according to write data in a program command. Based on its data state, a memory cell will either remain in the erased state or be programmed to a data state (a programmed data state) different from the erased state. For example, in a one-bit per cell memory device (single-level cell (SLC)), there are two data states including the erased state and one higher data state. In a two-bit per cell memory device (multi-level cell (MLC)), there are four data states including the erased state and three higher data states referred to as the A, B and C data states (see FIG. 9). In a three-bit per cell memory device (triple-level cell (TLC)), there are eight data states including the erased state and seven higher data states referred to as the A, B, C, D, E, F and G data states (see FIG. 10). In a four-bit per cell memory device (quad-level cell (QLC)), there are sixteen data states including the erased state and fifteen higher data states referred to as the Er, 1, 2, 3, 4, 5, 6, 7, 8, 9, A, B, C, D, E and F data states (see FIG. 11). Each memory cell may store a data state (e.g., a binary value) and is programmed to a threshold voltage state corresponding to the data state. Each state represents a different value and is assigned a voltage window including a range of possible threshold voltages.

Once memory cells are programmed, they may be read by applying a read voltage corresponding to one of the data states to a selected word line WLn connected to the memory cells being read, while applying a read pass voltage to the unselected word lines to allow the memory cells connected to the unselected word lines to conduct. A voltage may also applied to bit lines coupled to the memory cells being read. The threshold voltage for each of the memory cells being read is sensed for a sense or sensing time. Because the data states of neighboring memory cells can affect the threshold voltage of a memory cells during a read operation, pre-reads of memory cells of neighboring word lines may be employed as part of a dynamic look ahead (DLA) (pre-read of memory cells of a word line WLn+1 programmed after the selected word line) or look neighbor ahead (LNA) (pre-read of memory cells of both the word line programmed before WLn−1 and after WLn+1 the selected word line WLn) to account for the data states of neighboring memory cells during the read operation. Zones may be defined based on groupings of the data states of the memory cells of the neighboring word lines WLn+1, WLn−1. However, existing zoning methods do not always provide the read accuracy desired. Techniques provided herein address this and other issues.

Figure 1A:
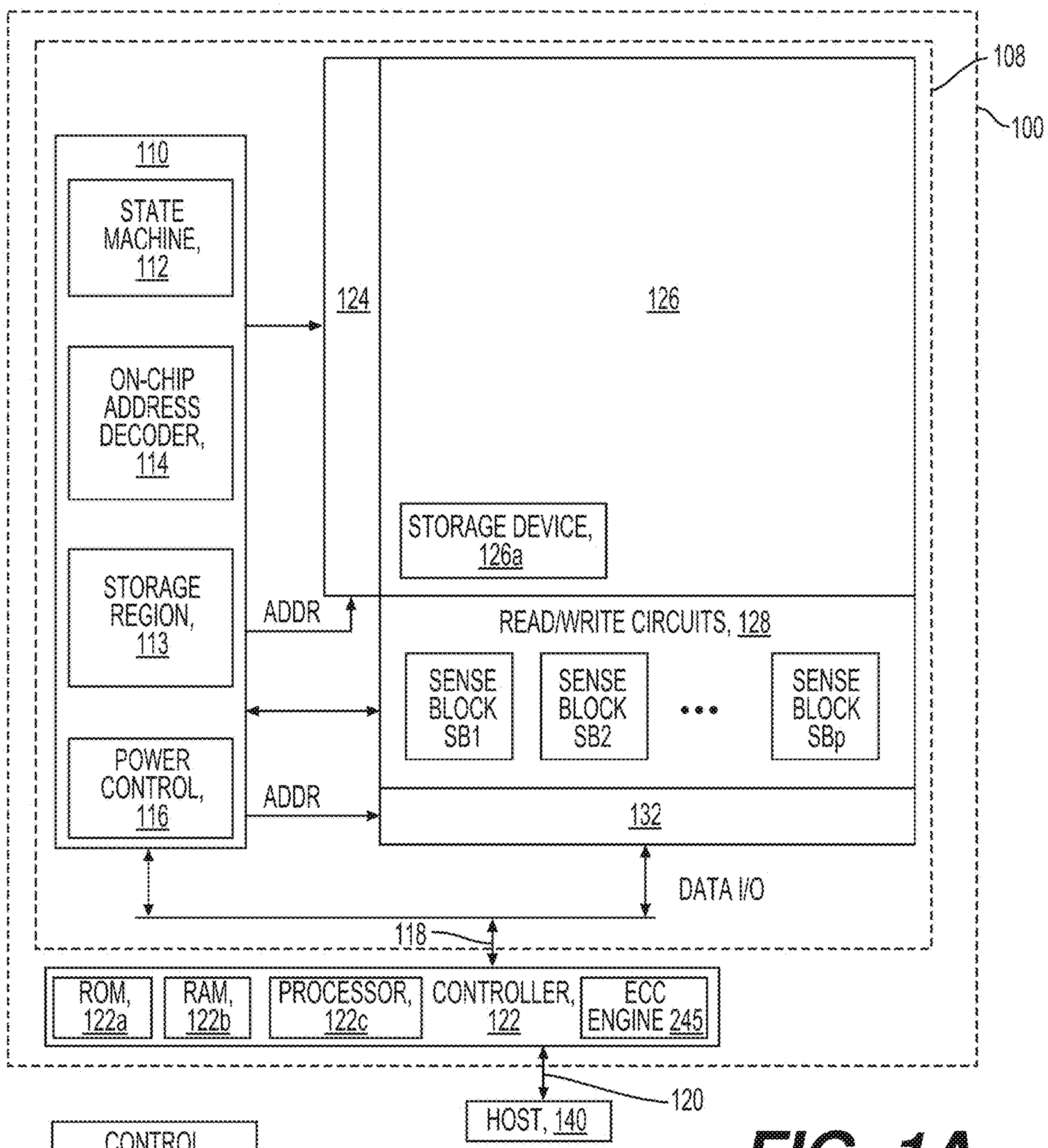
FIG. 1A is a block diagram of an example memory device according to aspects of the disclosure.

FIG. 1A will now be described. FIG. 1A is a block diagram of an example memory device. The memory device 100 may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks SB1, SB2, . . . , SBp (sensing circuitry) and allow a page of memory cells to be read or programmed in parallel. Typically a controller 122 is included in the same memory device 100 (e.g., a removable storage card) as the one or more memory die 108. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations. A storage region 113 may be provided, e.g., for verify parameters as described herein.

The on-chip address decoder 114 provides an address interface between that used by the host or a memory controller to the hardware address used by the decoders 124 and 132. The power control module 116 controls the power and voltages supplied to the word lines and bit lines during memory operations. It can include drivers for word lines, SGS and SGD transistors and source lines. The sense blocks can include bit line drivers, in one approach. An SGS transistor is a select gate transistor at a source end of a NAND string, and an SGD transistor is a select gate transistor at a drain end of a NAND string.

In some implementations, some of the components can be combined. In various designs, one or more of the components (alone or in combination), other than memory structure 126, can be thought of as at least one control circuit which is configured to perform the actions described herein. For example, a control circuit may include any one of, or a combination of, control circuitry 110, state machine 112, decoders 114/132, power control module 116, sense blocks SBb, SB2, . . . , SBp, read/write circuits 128, controller 122, and so forth.

The control circuits can include a programming circuit configured to program memory cells of a word line of a block and verify the set of the memory cells. The control circuits can also include a counting circuit configured to determine a number of memory cells that are verified to be in a data state. The control circuits can also include a determination circuit configured to determine, based on the number, whether the block is faulty.

Figure 1B:
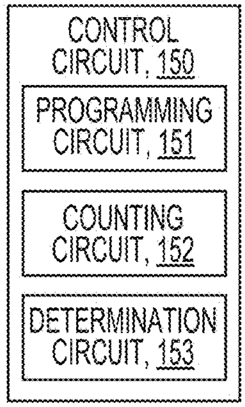
FIG. 1B is a block diagram of an example control circuit which comprises a programming circuit, a counting circuit, and a determination circuit according to aspects of the disclosure.

For example, FIG. 1B is a block diagram of an example control circuit 150 which comprises a programming circuit 151, a counting circuit 152 and a determination circuit 153. The programming circuit may include software, firmware and/or hardware. The counting circuit may include software, firmware and/or hardware. The determination circuit may include software, firmware and/or hardware.

The off-chip controller 122 may comprise a processor 122*c*, storage devices (memory) such as ROM 122*a* and RAM 122*b* and an error-correction code (ECC) engine 245. The ECC engine can correct a number of read errors which are caused when the upper tail of a Vth distribution becomes too high. However, uncorrectable errors may exists in some cases. The techniques provided herein reduce the likelihood of uncorrectable errors.

The storage device comprises code such as a set of instructions, and the processor is operable to execute the set of instructions to provide the functionality described herein. Alternatively or additionally, the processor can access code from a storage device 126*a* of the memory structure, such as a reserved area of memory cells in one or more word lines.

For example, code can be used by the controller 122 to access the memory structure such as for programming, read and erase operations. The code can include boot code and control code (e.g., set of instructions). The boot code is software that initializes the controller during a booting or startup process and enables the controller to access the memory structure. The code can be used by the controller to control one or more memory structures. Upon being powered up, the processor 122*c* fetches the boot code from the ROM 122*a* or storage device 126*a* for execution, and the boot code initializes the system components and loads the control code into the RAM 122*b*. Once the control code is loaded into the RAM, it is executed by the processor. The control code includes drivers to perform basic tasks such as controlling and allocating memory, prioritizing the processing of instructions, and controlling input and output ports.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements. The columns may be arranged in a two dimensional configuration, e.g., in an x-y plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the two dimensional and three dimensional exemplary structures described but covers all relevant memory structures within the spirit and scope of the technology as described herein and as understood by one of skill in the art.

Figure 2:
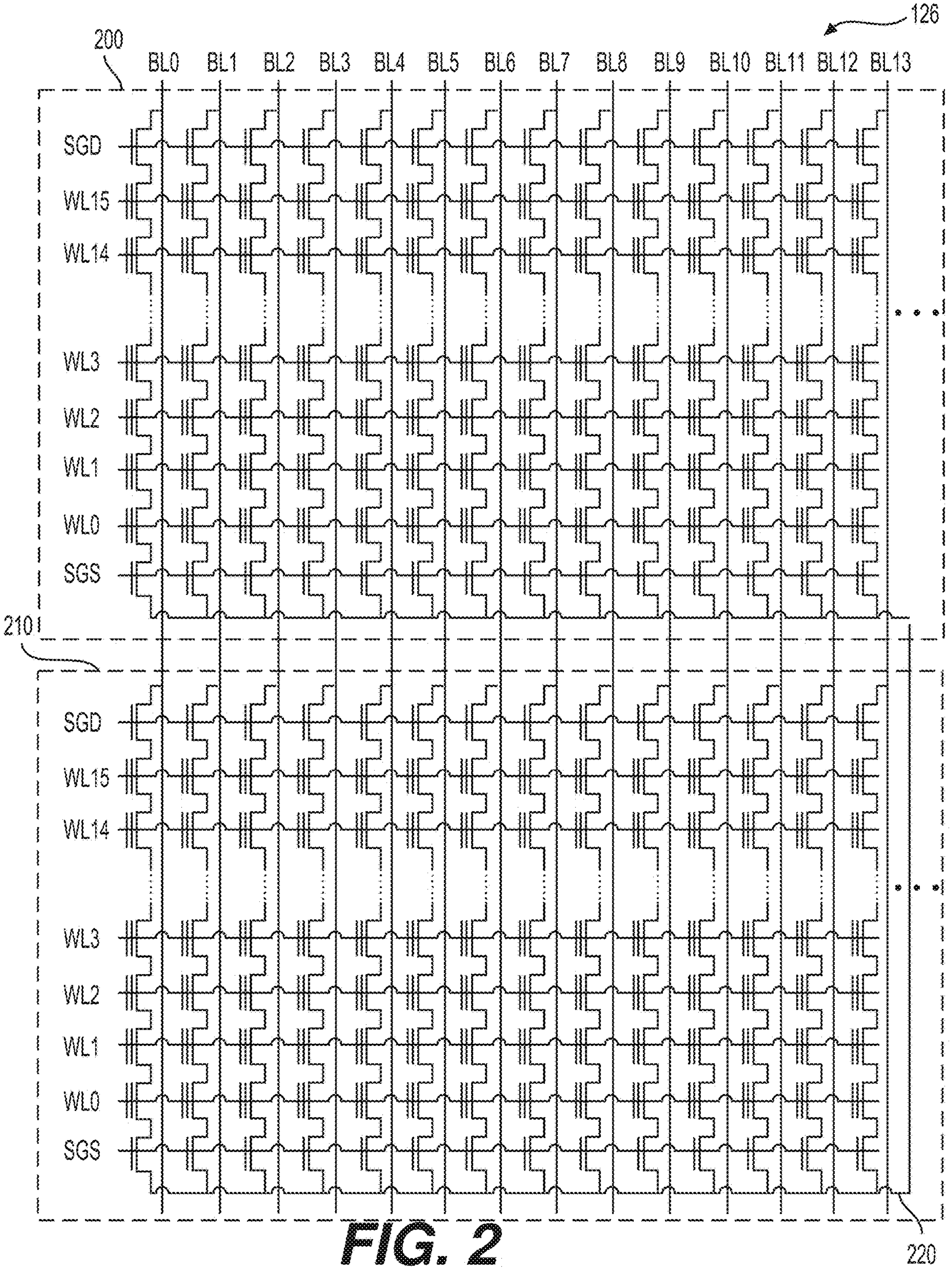
FIG. 2 depicts blocks of memory cells in an example two-dimensional configuration of the memory array of FIG. 1A.

FIG. 2 depicts blocks of memory cells in an example two-dimensional configuration of the memory array 126 of FIG. 1A. The memory array can include many blocks. Each example block 200, 210 includes a number of NAND strings and respective bit lines, e.g., BL0, BL1, . . . which are shared among the blocks. Each NAND string is connected at one end to a drain select gate (SGD), and the control gates of the drain select gates are connected via a common SGD line. The NAND strings are connected at their other end to a source select gate which, in turn, is connected to a common source line 220. Sixteen word lines, for example, WL0-WL15, extend between the source select gates and the drain select gates. In some cases, dummy word lines, which contain no user data, can also be used in the memory array adjacent to the select gate transistors. Such dummy word lines can shield the edge data word line from certain edge effects.

One type of non-volatile memory which may be provided in the memory array is a floating gate memory. See FIGS. 3A and 3B. Other types of non-volatile memory can also be used. For example, a charge-trapping memory cell uses a non-conductive dielectric material in place of a conductive floating gate to store charge in a non-volatile manner. See FIGS. 4A and 4B. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

Figure 3A:
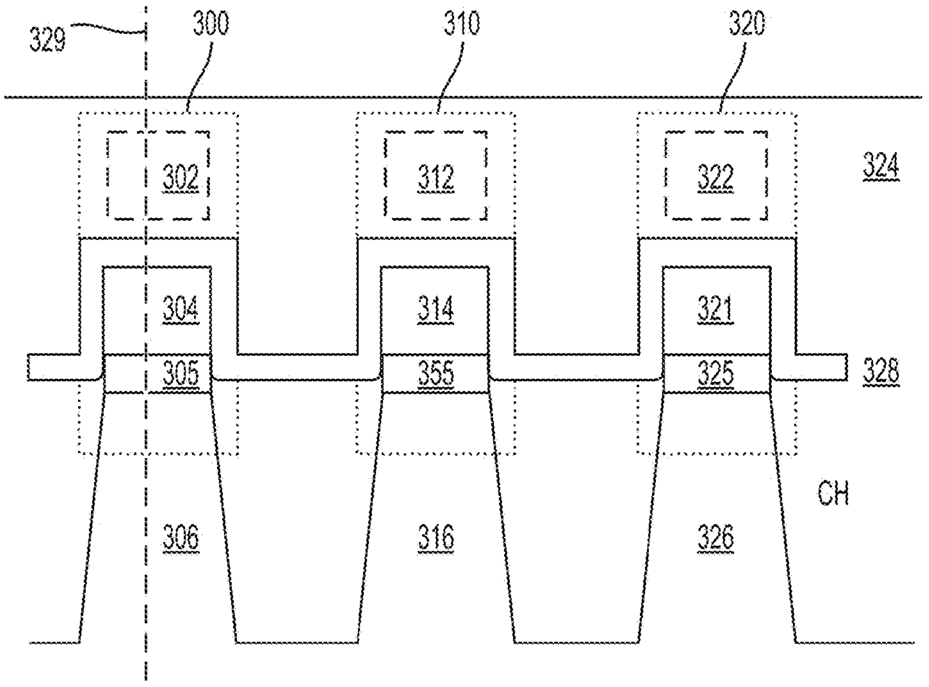
FIG. 3A depicts a cross-sectional view of example floating gate memory cells in NAND strings according to aspects of the disclosure.

FIG. 3A depicts a cross-sectional view of example floating gate memory cells in NAND strings. A bit line or NAND string direction goes into the page, and a word line direction goes from left to right. As an example, word line 324 extends across NAND strings which include respective channel regions 306, 316 and 326. The memory cell 300 includes a control gate 302, a floating gate 304, a tunnel oxide layer 305 and the channel region 306. The memory cell 310 includes a control gate 312, a floating gate 314, a tunnel oxide layer 315 and the channel region 316. The memory cell 320 includes a control gate 322, a floating gate 321, a tunnel oxide layer 325 and the channel region 326. Each memory cell is in a different respective NAND string. An inter-poly dielectric (IPD) layer 328 is also depicted. The control gates are portions of the word line. A cross-sectional view along line 329 is provided in FIG. 3B.

Figure 4A:
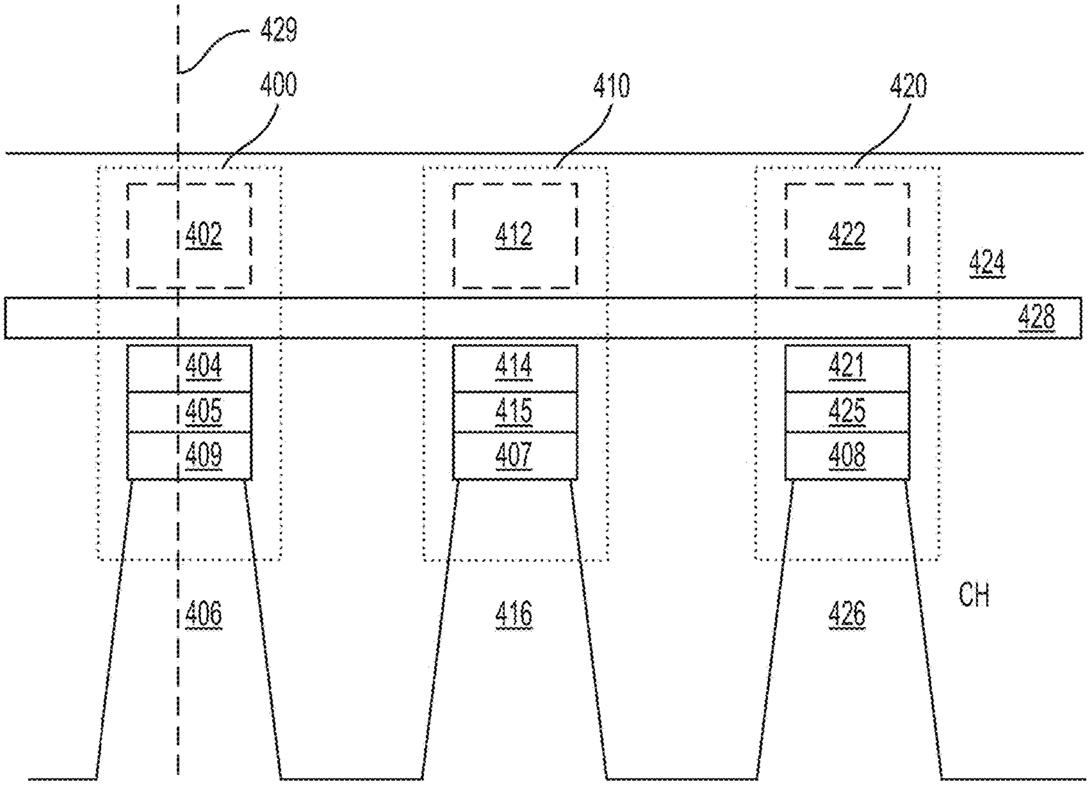
FIG. 4A depicts a cross-sectional view of example charge-trapping memory cells in NAND strings according to aspects of the disclosure.
Figure 4B:
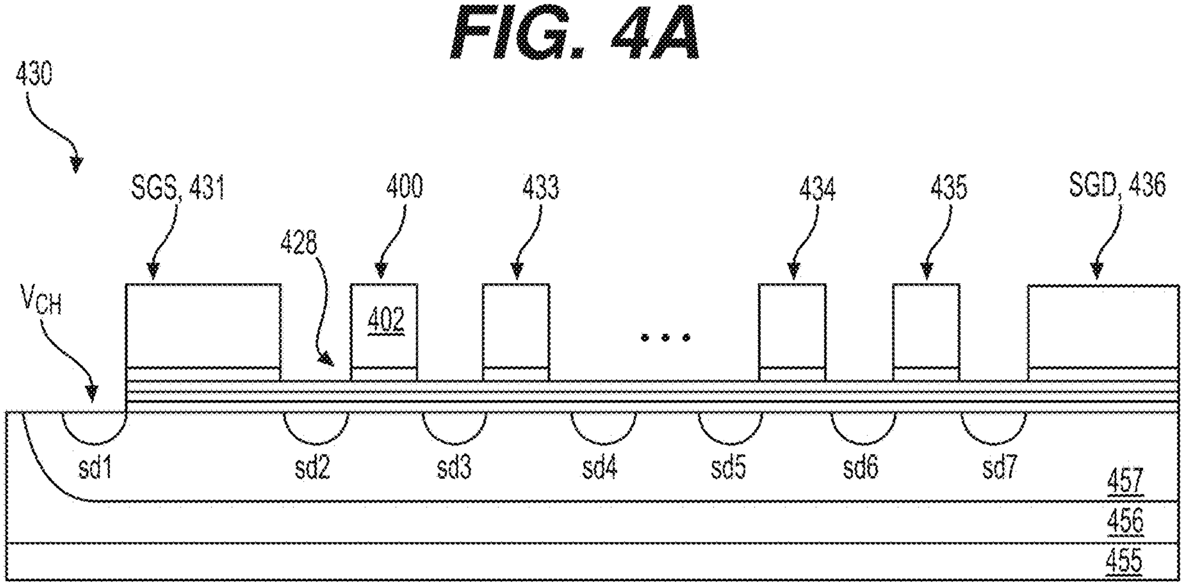
FIG. 4B depicts a cross-sectional view of the structure of FIG. 4A along line 429 according to aspects of the disclosure.

The control gate wraps around the floating gate, increasing the surface contact area between the control gate and floating gate. This results in higher IPD capacitance, leading to a higher coupling ratio which makes programming and erase easier. However, as NAND memory devices are scaled down, the spacing between neighboring cells becomes smaller so there is almost no space for the control gate and the IPD between two adjacent floating gates. As an alternative, as shown in FIGS. 4A and 4B, the flat or planar memory cell has been developed in which the control gate is flat or planar; that is, it does not wrap around the floating gate, and its only contact with the charge storage layer is from above it. In this case, there is no advantage in having a tall floating gate. Instead, the floating gate is made much thinner. Further, the floating gate can be used to store charge, or a thin charge trap layer can be used to trap charge. This approach can avoid the issue of ballistic electron transport, where an electron can travel through the floating gate after tunneling through the tunnel oxide during programming.

Figure 3B:
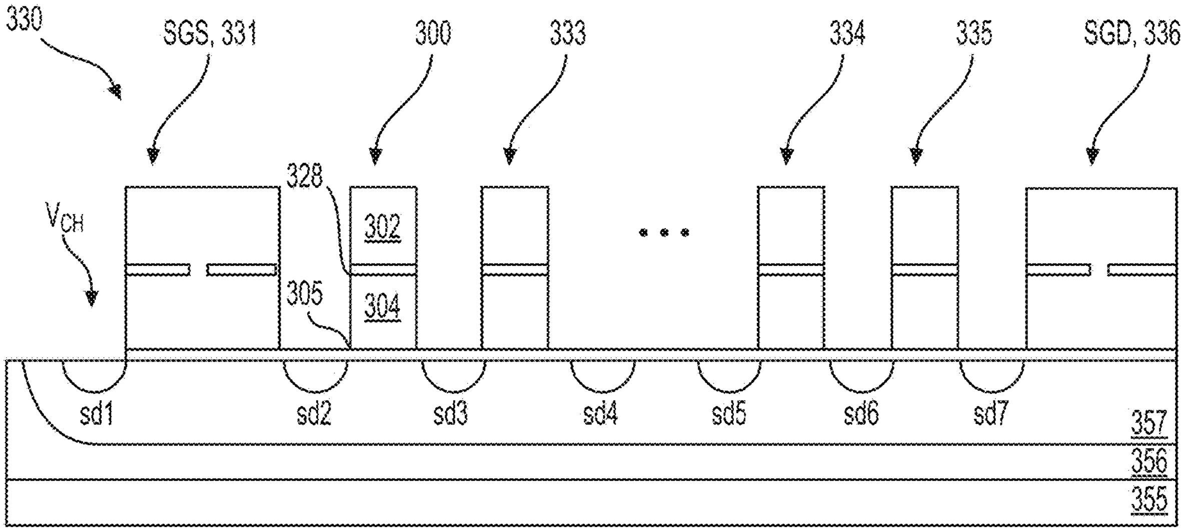
FIG. 3B depicts a cross-sectional view of the structure of FIG. 3A along line 329 according to aspects of the disclosure.

FIG. 3B depicts a cross-sectional view of the structure of FIG. 3A along line 329. The NAND string 330 includes an SGS transistor 331, example memory cells 300, 333, . . . , 334 and 335, and an SGD transistor 336. The memory cell 300, as an example of each memory cell, includes the control gate 302, the IPD layer 328, the floating gate 304 and the tunnel oxide layer 305, consistent with FIG. 3A. Passageways in the IPD layer in the SGS and SGD transistors allow the control gate layers and floating gate layers to communicate. The control gate and floating gate layers may be polysilicon and the tunnel oxide layer may be silicon oxide, for instance. The IPD layer can be a stack of nitrides (N) and oxides (O) such as in a N—O—N—O—N configuration.

The NAND string may be formed on a substrate which comprises a p-type substrate region 355, an n-type well 356 and a p-type well 357. N-type source/drain diffusion regions sd1, sd2, sd3, sd4, sd5, sd6 and sd7 are formed in the p-type well. A channel voltage, Vch, may be applied directly to the channel region of the substrate.

FIG. 4A depicts a cross-sectional view of example charge-trapping memory cells in NAND strings. The view is in a word line direction of memory cells comprising a flat control gate and charge-trapping regions as a 2D example of memory cells in the memory cell array 126 of FIG. 1A. Charge-trapping memory can be used in NOR and NAND flash memory device. This technology uses an insulator such as an SiN film to store electrons, in contrast to a floating-gate MOSFET technology which uses a conductor such as doped polycrystalline silicon to store electrons. As an example, a word line (WL) 424 extends across NAND strings which include respective channel regions 406, 416 and 426. Portions of the word line provide control gates 402, 412 and 422. Below the word line is an IPD layer 428, charge-trapping layers 404, 414 and 421, polysilicon layers 405, 415 and 425 and tunneling layer layers 409, 407 and 408. Each charge-trapping layer extends continuously in a respective NAND string.

A memory cell 400 includes the control gate 402, the charge-trapping layer 404, the polysilicon layer 405 and a portion of the channel region 406. A memory cell 410 includes the control gate 412, the charge-trapping layer 414, a polysilicon layer 415 and a portion of the channel region 416. A memory cell 420 includes the control gate 422, the charge-trapping layer 421, the polysilicon layer 425 and a portion of the channel region 426.

A flat control gate is used here instead of a control gate that wraps around a floating gate. One advantage is that the charge-trapping layer can be made thinner than a floating gate. Additionally, the memory cells can be placed closer together.

FIG. 4B depicts a cross-sectional view of the structure of FIG. 4A along line 429. The view shows a NAND string 430 having a flat control gate and a charge-trapping layer. The NAND string 430 includes an SGS transistor 431, example memory cells 400, 433, . . . , 434 and 435, and an SGD transistor 435.

The NAND string may be formed on a substrate which comprises a p-type substrate region 455, an n-type well 456 and a p-type well 457. N-type source/drain diffusion regions sd1, sd2, sd3, sd4, sd5, sd6 and sd7 are formed in the p-type well 457. A channel voltage, Vch, may be applied directly to the channel region of the substrate. The memory cell 400 includes the control gate 402 and the IPD layer 428 above the charge-trapping layer 404, the polysilicon layer 405, the tunneling layer 409 and the channel region 406.

The control gate layer may be polysilicon and the tunneling layer may be silicon oxide, for instance. The IPD layer can be a stack of high-k dielectrics such as AlOx or HfOx which help increase the coupling ratio between the control gate layer and the charge-trapping or charge storing layer. The charge-trapping layer can be a mix of silicon nitride and oxide, for instance.

The SGD and SGS transistors have the same configuration as the memory cells but with a longer channel length to ensure that current is cutoff in an inhibited NAND string.

In this example, the layers 404, 405 and 409 extend continuously in the NAND string. In another approach, portions of the layers 404, 405 and 409 which are between the control gates 402, 412 and 422 can be removed, exposing a top surface of the channel 406.

Figure 5A:
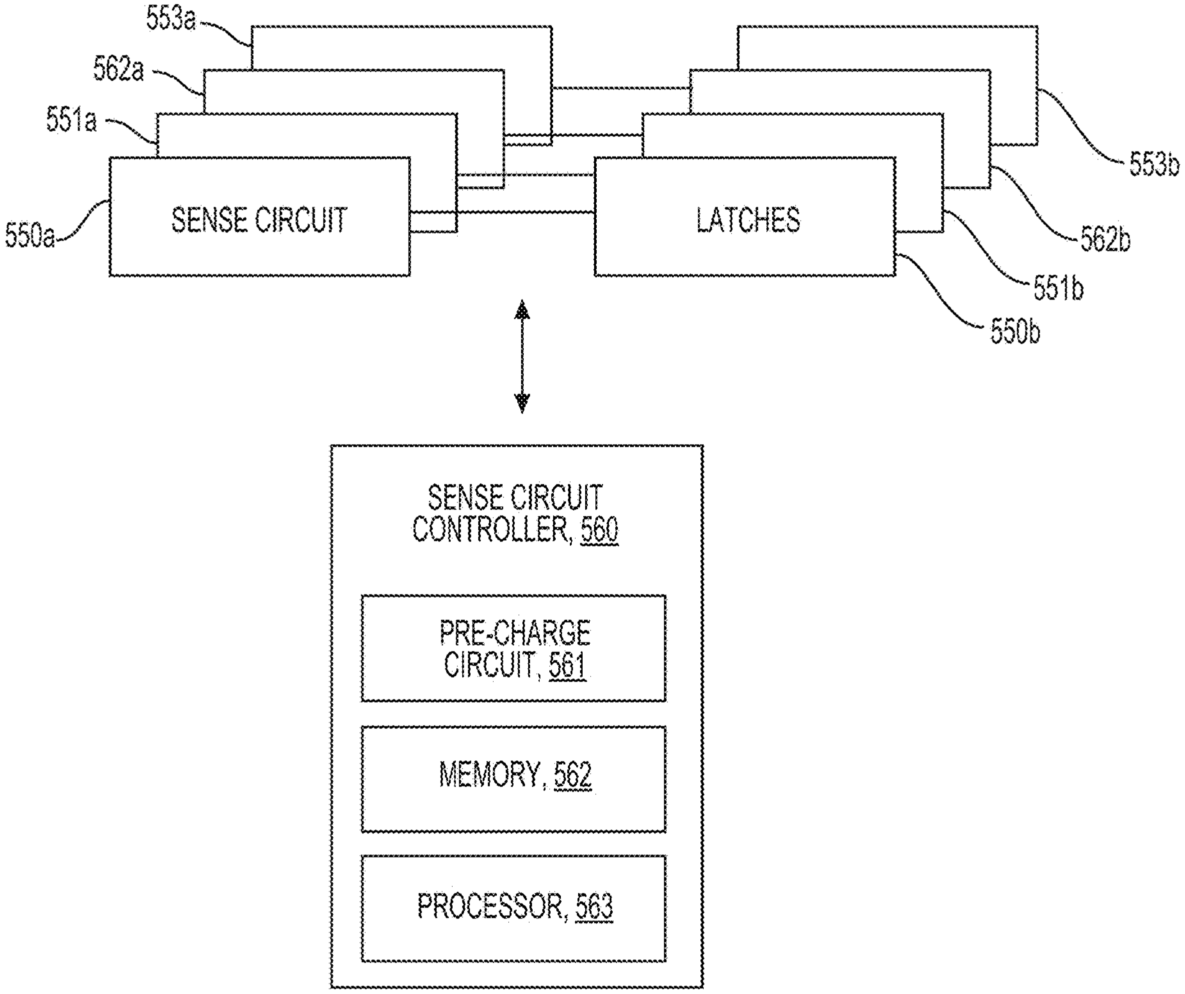
FIG. 5A depicts an example block diagram of the sense block SB1 of FIG. 1A according to aspects of the disclosure.

FIG. 5A depicts an example block diagram of the sense block SB1 of FIG. 1A. In one approach, a sense block comprises multiple sense circuits. Each sense circuit is associated with data latches. For example, the example sense circuits 550a, 551a, 552a and 553a are associated with the data latches 550b, 551b, 552b and 553b, respectively. In one approach, different subsets of bit lines can be sensed using different respective sense blocks. This allows the processing load which is associated with the sense circuits to be divided up and handled by a respective processor in each sense block. For example, a sense circuit controller 560 in SB1 can communicate with the set of sense circuits and latches. The sense circuit controller may include a pre-charge circuit 561 which provides a voltage to each sense circuit for setting a pre-charge voltage. In one possible approach, the voltage is provided to each sense circuit independently, e.g., via the data base 503 and a local bus such as LBUS1 or LBUS2 in FIG. 5B. In another possible approach, a common voltage is provided to each sense circuit concurrently, e.g., via the line 505 in FIG. 5B. The sense circuit controller may also include a memory 562 and a processor 563. As mentioned also in connection with FIG. 2, the memory 562 may store code which is executable by the processor to perform the functions described herein. These functions can include reading latches which are associated with the sense circuits, setting bit values in the latches and providing voltages for setting pre-charge levels in sense nodes of the sense circuits. Further example details of the sense circuit controller and the sense circuits 550a and 551a are provided below.

Figure 5B:
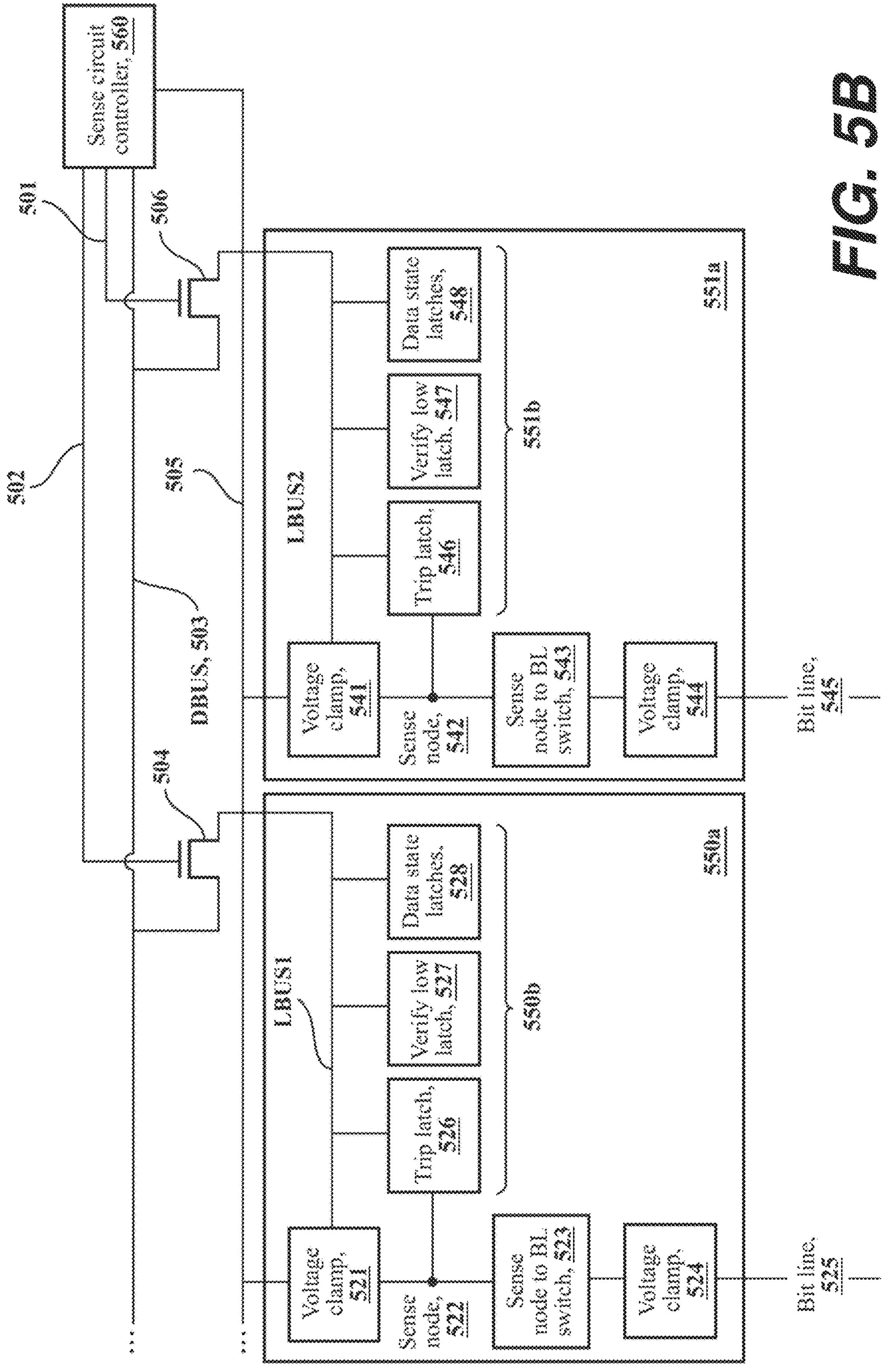
FIG. 5B depicts another example block diagram of the sense block SB1 of FIG. 1A according to aspects of the disclosure.

FIG. 5B depicts another example block diagram of the sense block SB1 of FIG. 1A. The sense circuit controller 560 communicates with multiple sense circuits including example sense circuits 550a and 551a, also shown in FIG. 5A. The sense circuit 550a includes latches 550b, including a trip latch 526, an offset verify latch 527 and data state latches 528. The sense circuit further includes a voltage clamp 521 such as a transistor which sets a pre-charge voltage at a sense node 522. A sense node to bit line (BL) switch 523 selectively allows the sense node to communicate with a bit line 525, e.g., the sense node is electrically connected to the bit line so that the sense node voltage can decay. The bit line 525 is connected to one or more memory cells such as a memory cell MC1. A voltage clamp 524 can set a voltage on the bit line, such as during a sensing operation or during a program voltage. A local bus, LBUS1, allows the sense circuit controller to communicate with components in the sense circuit, such as the latches 550b and the voltage clamp in some cases. To communicate with the sense circuit 550a, the sense circuit controller provides a voltage via a line 502 to a transistor 504 to connect LBUS1 with a data bus DBUS, 503. The communicating can include sending data to the sense circuit and/or receive data from the sense circuit.

The sense circuit controller can communicate with different sense circuits in a time-multiplexed manner, for instance. A line 505 may be connected to the voltage clamp in each sense circuit, in one approach.

The sense circuit 551*a* includes latches 551*b*, including a trip latch 546, an offset verify latch 547 and data state latches 548. A voltage clamp 541 may be used to set a pre-charge voltage at a sense node 542. A sense node to bit line (BL) switch 543 selectively allows the sense node to communicate with a bit line 545, and a voltage clamp 544 can set a voltage on the bit line. The bit line 545 is connected to one or more memory cells such as a memory cell MC2. A local bus, LBUS2, allows the sense circuit controller to communicate with components in the sense circuit, such as the latches 551*b* and the voltage clamp in some cases. To communicate with the sense circuit 551*a*, the sense circuit controller provides a voltage via a line 501 to a transistor 506 to connect LBUS2 with DBUS.

The sense circuit 550*a* may be a first sense circuit which comprises a first trip latch 526 and the sense circuit 551*a* may be a second sense circuit which comprises a second trip latch 546.

The sense circuit 550*a* is an example of a first sense circuit comprising a first sense node 522, where the first sense circuit is associated with a first memory cell MC1 and a first bit line 525. The sense circuit 551*a* is an example of a second sense circuit comprising a second sense node 542, where the second sense circuit is associated with a second memory cell MC2 and a second bit line 545.

Figure 6A:
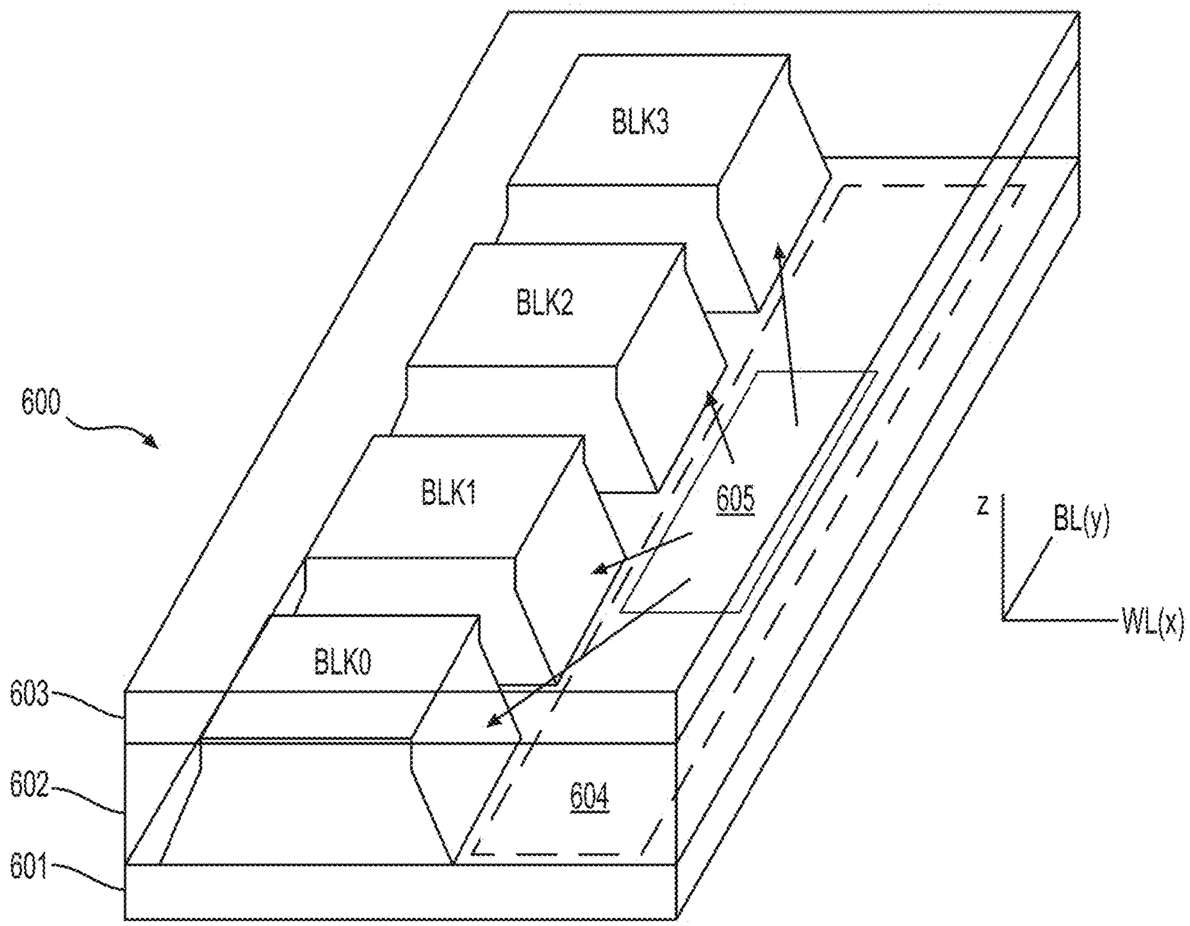
FIG. 6A is a perspective view of a set of blocks in an example three-dimensional configuration of the memory array of FIG. 1A according to aspects of the disclosure.

FIG. 6A is a perspective view of a set of blocks 600 in an example three-dimensional configuration of the memory array 126 of FIG. 1A. On the substrate are example blocks BLK0, BLK1, BLK2 and BLK3 of memory cells (storage elements) and a peripheral area 604 with circuitry for use by the blocks. For example, the circuitry can include voltage drivers 605 which can be connected to control gate layers of the blocks. In one approach, control gate layers at a common height in the blocks are commonly driven. The substrate 601 can also carry circuitry under the blocks, along with one or more lower metal layers which are patterned in conductive paths to carry signals of the circuitry. The blocks are formed in an intermediate region 602 of the memory device. In an upper region 603 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 6B:
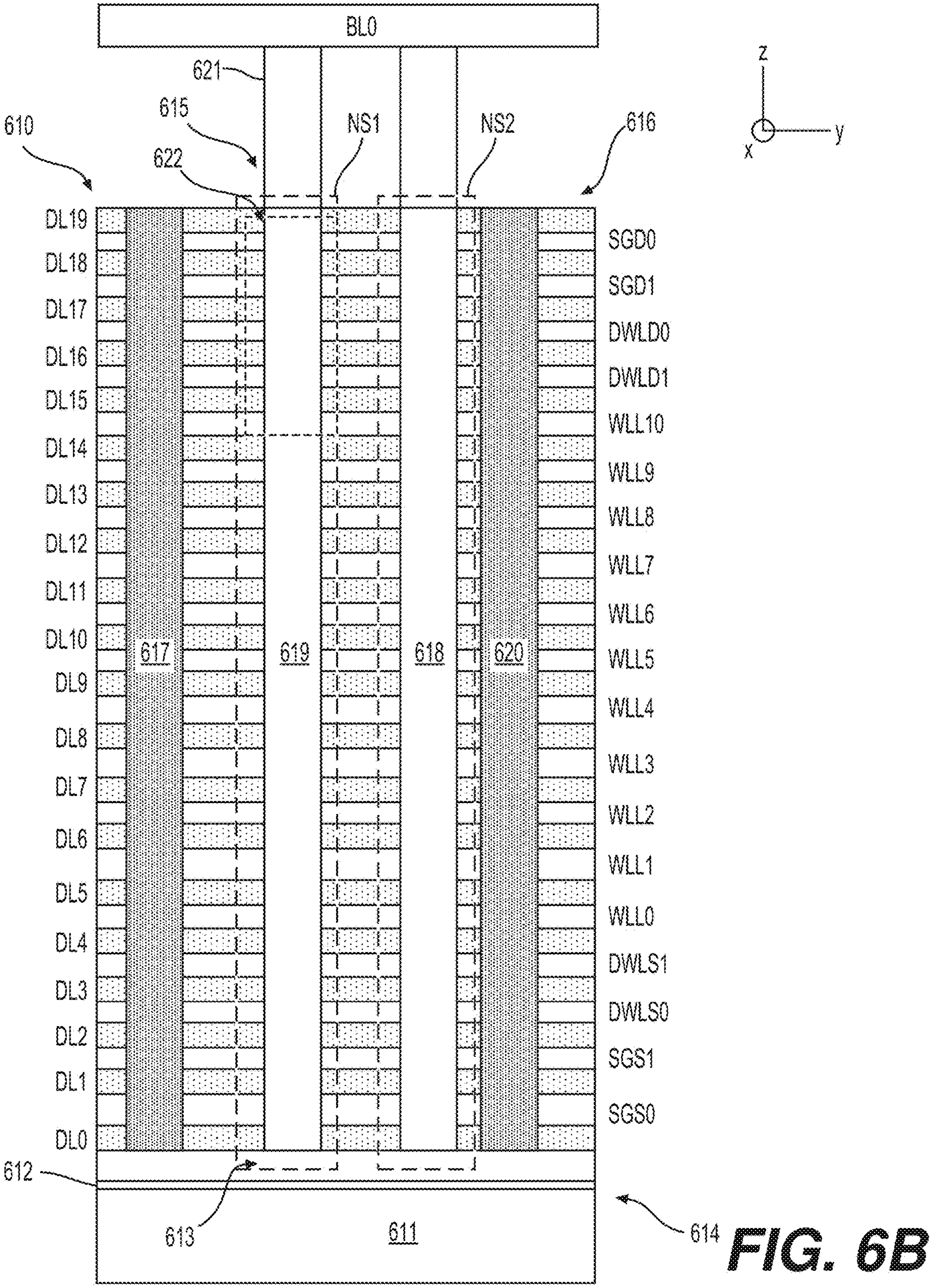
FIG. 6B depicts an example cross-sectional view of a portion of one of the blocks of FIG. 6A according to aspects of the disclosure.

FIG. 6B depicts an example cross-sectional view of a portion of one of the blocks of FIG. 6A. The block comprises a stack 610 of alternating conductive and dielectric layers. In this example, the conductive layers comprise two SGD layers, two SGS layers and four dummy word line layers DWLD0, DWLD1, DWLS0 and DWLS1, in addition to data word line layers (word lines) WLL0-WLL10. The dielectric layers are labelled as DL0-DL19. Further, regions of the stack which comprise NAND strings NS1 and NS2 are depicted. Each NAND string encompasses a memory hole 618 or 619 which is filled with materials which form memory cells adjacent to the word lines. A region 622 of the stack is shown in greater detail in FIG. 6D.

The stack includes a substrate 611, an insulating film 612 on the substrate, and a portion of a source line SL. NS1 has a source-end 613 at a bottom 614 of the stack and a drain-end 615 at a top 616 of the stack. Metal-filled slits 617 and 620 may be provided periodically across the stack as interconnects which extend through the stack, such as to connect the source line to a line above the stack. The slits may be used during the formation of the word lines and subsequently filled with metal. A portion of a bit line BL0 is also depicted. A conductive via 621 connects the drain-end 615 to BL0.

Figure 6C:
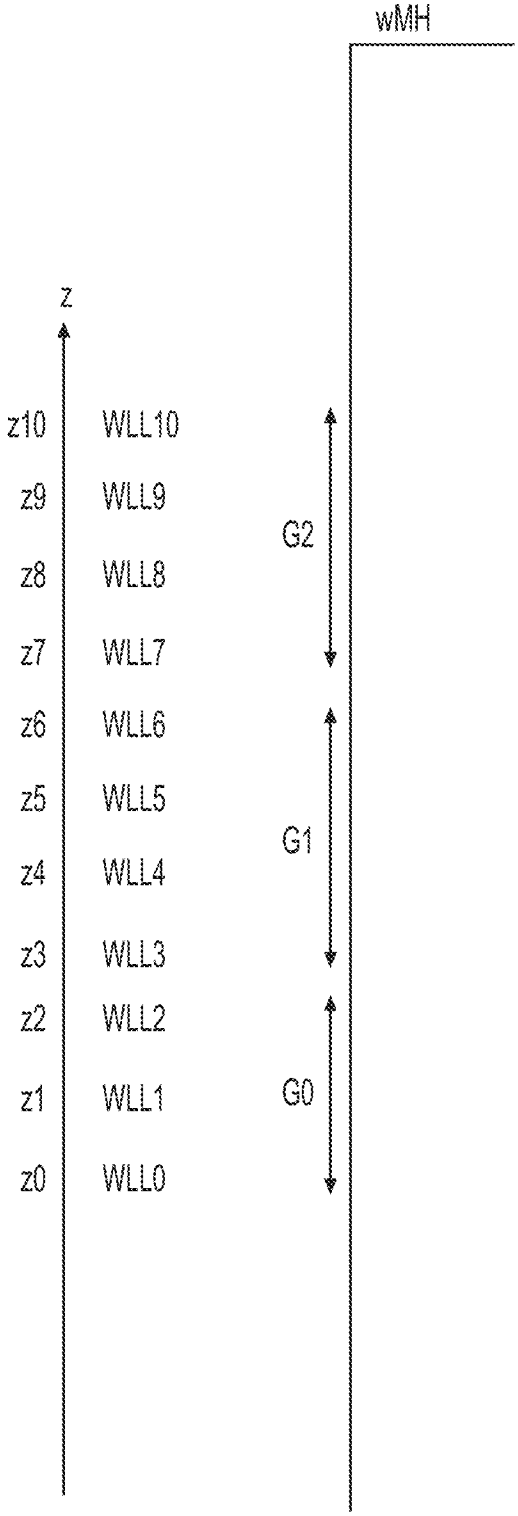
FIG. 6C depicts a plot of memory hole diameter in the stack of FIG. 6B according to aspects of the disclosure.

FIG. 6C depicts a plot of memory hole diameter in the stack of FIG. 6B. The vertical axis is aligned with the stack of FIG. 6B and depicts a width (wMH), e.g., diameter, of the memory holes 618 and 619. The word line layers WLL0-WLL10 of FIG. 6A are repeated as an example and are at respective heights z0-z10 in the stack. In such a memory device, the memory holes which are etched through the stack have a very high aspect ratio. For example, a depth-to-diameter ratio of about 25-30 is common. The memory holes may have a circular cross-section. Due to the etching process, the memory hole width can vary along the length of the hole. Typically, the diameter becomes progressively smaller from the top to the bottom of the memory hole. That is, the memory holes are tapered, narrowing at the bottom of the stack. In some cases, a slight narrowing occurs at the top of the hole near the select gate so that the diameter becomes slight wider before becoming progressively smaller from the top to the bottom of the memory hole.

Due to the non-uniformity in the width of the memory hole, the programming speed, including the program slope and erase speed of the memory cells can vary based on their position along the memory hole, e.g., based on their height in the stack. With a smaller diameter memory hole, the electric field across the tunnel oxide is relatively stronger, so that the programming and erase speed is relatively higher. One approach is to define groups of adjacent word lines for which the memory hole diameter is similar, e.g., within a defined range of diameter, and to apply an optimized verify scheme for each word line in a group. Different groups can have different optimized verify schemes.

Figure 6D:
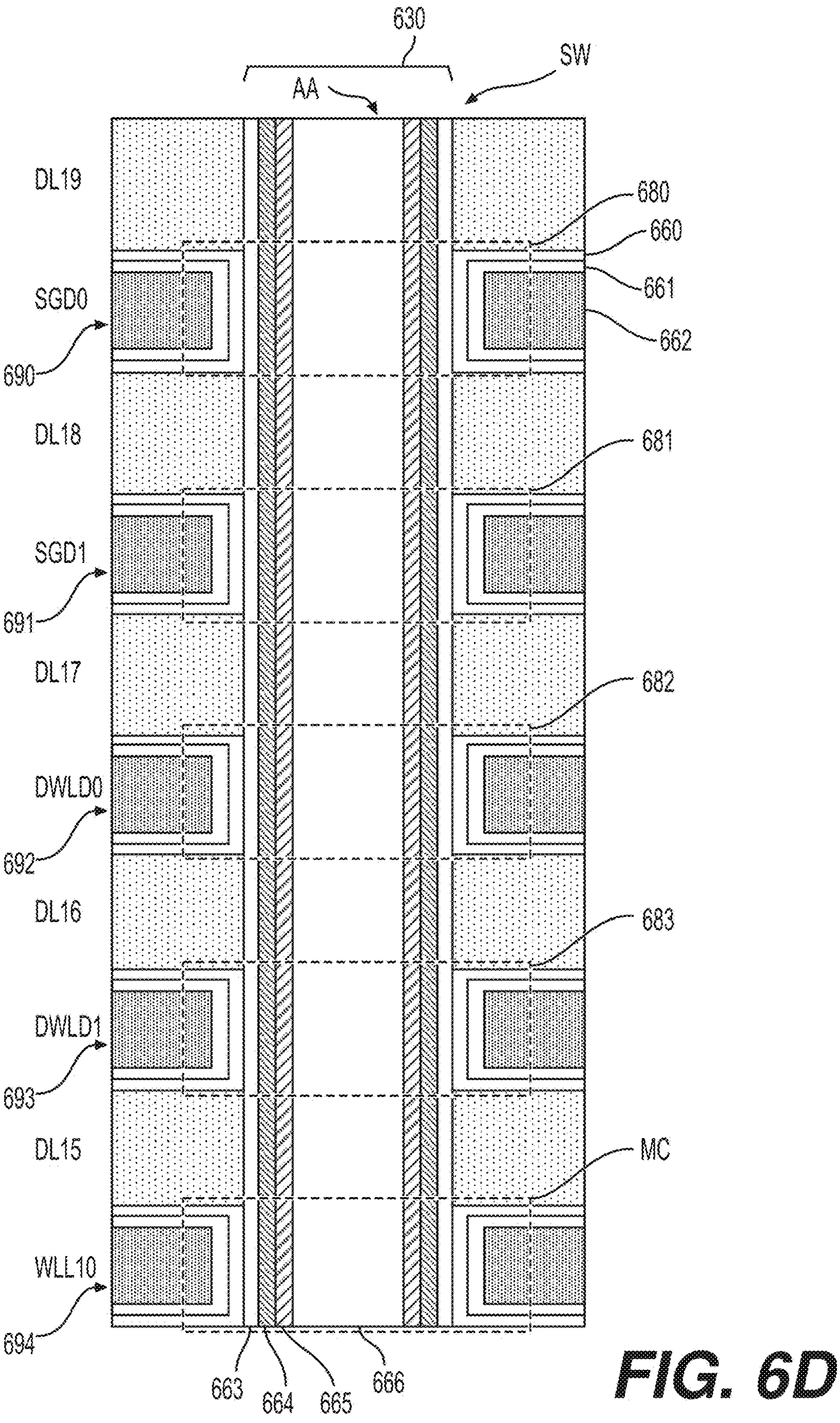
FIG. 6D depicts a close-up view of the region 622 of the stack of FIG. 6B according to aspects of the disclosure.

FIG. 6D depicts a close-up view of the region 622 of the stack of FIG. 6B. Memory cells are formed at the different levels of the stack at the intersection of a word line layer and a memory hole. In this example, SGD transistors 680 and 681 are provided above dummy memory cells 682 and 683 and a data memory cell MC. A number of layers can be deposited along the sidewall (SW) of the memory hole 630 and/or within each word line layer, e.g., using atomic layer deposition. For example, each column (e.g., the pillar which is formed by the materials within a memory hole) can include a charge-trapping layer or film 663 such as SiN or other nitride, a tunneling layer 664, a polysilicon body or channel 665, and a dielectric core 666. A word line layer can include a blocking oxide/block high-k material 660, a metal barrier 661, and a conductive metal 662 such as Tungsten as a control gate. For example, control gates 690, 691, 692, 693 and 694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

Figure 7A:
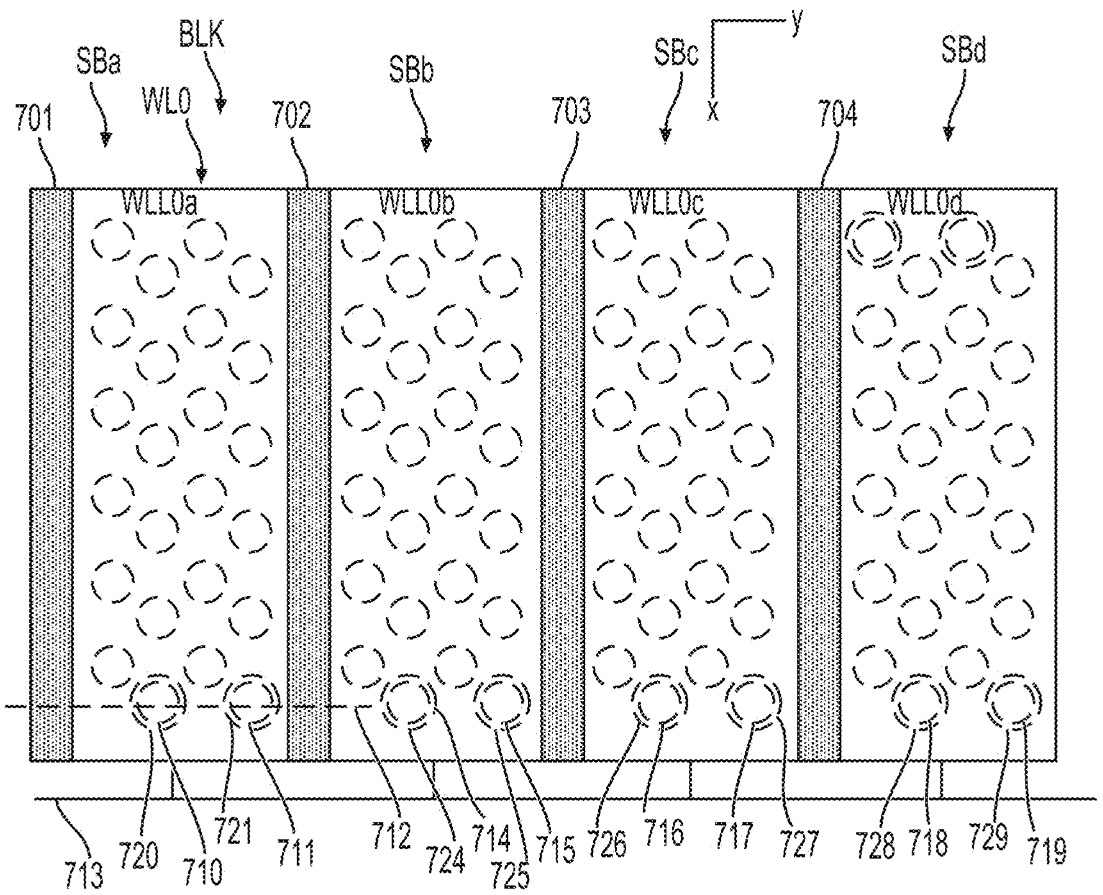
FIG. 7A depicts a top view of an example word line layer WLL0 of the stack of FIG. 6B according to aspects of the disclosure.

FIG. 7A depicts a top view of an example word line layer WLL0 of the stack of FIG. 6B. As mentioned, a 3D memory device can comprise a stack of alternating conductive and dielectric layers. The conductive layers provide the control gates of the SG transistors and memory cells. The layers used for the SG transistors are SG layers and the layers used for the memory cells are word line layers. Further, memory holes are formed in the stack and filled with a charge-trapping material and a channel material. As a result, a vertical NAND string is formed. Source lines are connected to the NAND strings below the stack and bit lines are connected to the NAND strings above the stack.

A block BLK in a 3D memory device can be divided into sub-blocks, where each sub-block comprises a set of NAND string which have a common SGD control line. For example, see the SGD lines/control gates SGD0, SGD1, SGD2 and SGD3 in the sub-blocks SBa, SBb, SBc and SBd, respectively. The sub-blocks SBa, SBb, SBc and SBd may also be referred herein as a string of memory cells of a word line. As described, a string of memory cells of a word line may include a plurality of memory cells that are part of the same sub-block, and that are also disposed in the same word line layer and/or that are configured to have their control gates biased by the same word line and/or with the same word line voltage.

Further, a word line layer in a block can be divided into regions. Each region is in a respective sub-block are can extend between slits which are formed periodically in the stack to process the word line layers during the fabrication process of the memory device. This processing can include replacing a sacrificial material of the word line layers with metal. Generally, the distance between slits should be relatively small to account for a limit in the distance that an etchant can travel laterally to remove the sacrificial material, and that the metal can travel to fill a void which is created by the removal of the sacrificial material. For example, the distance between slits may allow for a few rows of memory holes between adjacent slits. The layout of the memory holes and slits should also account for a limit in the number of bit lines which can extend across the region while each bit line is connected to a different memory cell. After processing the word line layers, the slits can optionally be filed with metal to provide an interconnect through the stack.

This figures and other are not necessarily to scale. In practice, the regions can be much longer in the x-direction relative to the y-direction than is depicted to accommodate additional memory holes.

Figure 7B:
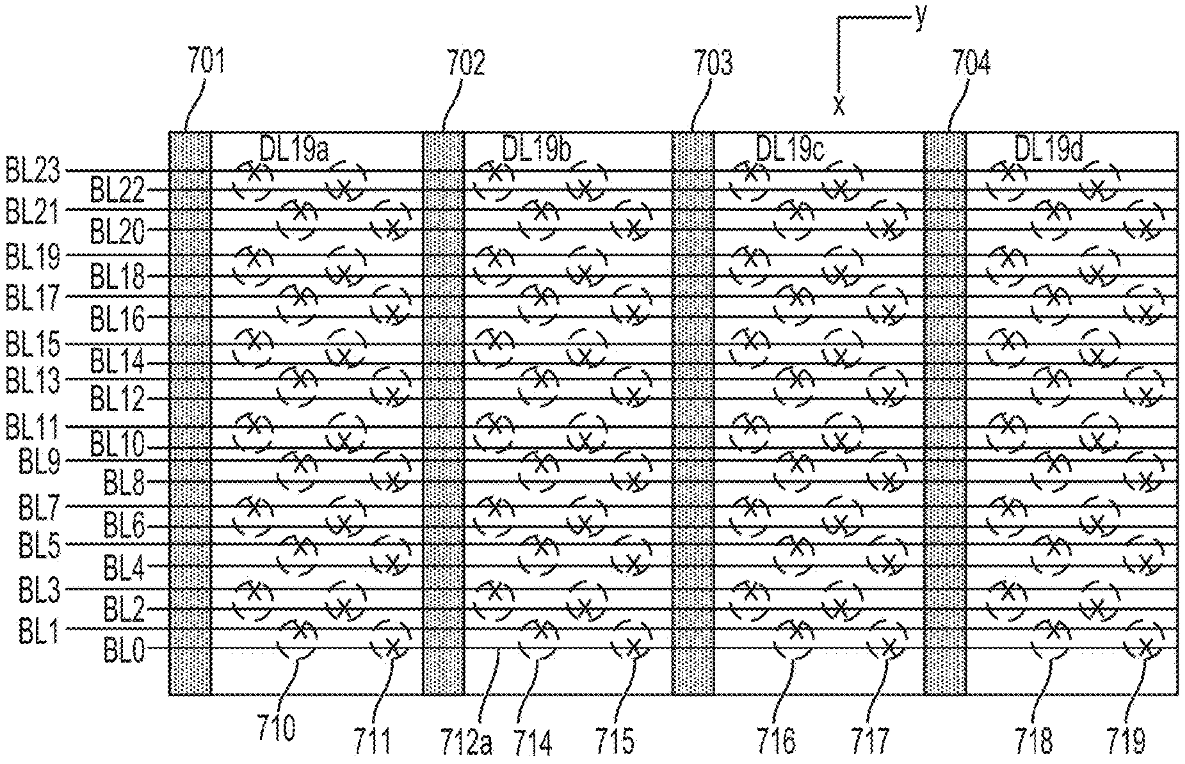
FIG. 7B depicts a top view of an example top dielectric layer DL19 of the stack of FIG. 6B according to aspects of the disclosure.

In this example, there are four rows of memory holes between adjacent slits. A row here is a group of memory holes which are aligned in the x-direction. Moreover, the rows of memory holes are in a staggered pattern to increase the density of the memory holes. The word line layer or word line is divided into regions WLL0 *a*, WLL0 *b*, WLL0 *c* and WLL0 *d* which are each connected by a connector 713. The last region of a word line layer in a block can be connected to a first region of a word line layer in a next block, in one approach. The connector, in turn, is connected to a voltage driver for the word line layer. The region WLL0 *a* has example memory holes 710 and 711 along a line 712. The region WLL0 *b* has example memory holes 714 and 715. The region WLL0 *c* has example memory holes 716 and 717. The region WLL0 *d* has example memory holes 718 and 719. The memory holes are also shown in FIG. 7B. Each memory hole can be part of a respective NAND string. For example, the memory holes 710, 714, 716 and 718 can be part of NAND strings NS0_SBa, NS0_SBb, NS0_SBc and NS0_SBd, respectively.

Each circle represents the cross-section of a memory hole at a word line layer or SG layer. Example circles shown with dashed lines represent memory cells which are provided by the materials in the memory hole and by the adjacent word line layer. For example, memory cells 720 and 721 are in WLL0 *a*, memory cells 724 and 725 are in WLL0 *b*, memory cells 726 and 727 are in WLL0 *c*, and memory cells 728 and 729 are in WLL0 *d*. These memory cells are at a common height in the stack.

Metal-filled slits 701, 702, 703 and 704 (e.g., metal interconnects) may be located between and adjacent to the edges of the regions WLL0 *a*-WLL0 *d*. The metal-filled slits provide a conductive path from the bottom of the stack to the top of the stack. For example, a source line at the bottom of the stack may be connected to a conductive line above the stack, where the conductive line is connected to a voltage driver in a peripheral region of the memory device. See also FIG. 8A for further details of the sub-blocks SBa-SBd of FIG. 7A.

FIG. 7B depicts a top view of an example top dielectric layer DL19 of the stack of FIG. 6B. The dielectric layer is divided into regions DL19 *a*, DL19 *b*, DL19 *c* and DL19 *d*. Each region can be connected to a respective voltage driver. This allows a set of memory cells in one region of a word line layer to be programmed concurrently, with each memory cell being in a respective NAND string which is connected to a respective bit line. A voltage can be set on each bit line to allow or inhibit programming during each program voltage.

The region DL 19*a* has the example memory holes 710 and 711 along a line 712*a* which is coincident with a bit line BL0. A number of bit lines extend above the memory holes and are connected to the memory holes as indicated by the "X" symbols. BL0 is connected to a set of memory holes which includes the memory holes 711, 715, 717 and 719. Another example bit line BL1 is connected to a set of memory holes which includes the memory holes 710, 714, 716 and 718. The metal-filled slits 701, 702, 703 and 704 from FIG. 7A are also depicted, as they extend vertically through the stack. The bit lines can be numbered in a sequence BL0-BL23 across the DL19 layer in the −x direction.

Different subsets of bit lines are connected to cells in different rows. For example, BL0, BL4, BL8, BL12, BL16 and BL20 are connected to cells in a first row of cells at the right hand edge of each region. BL2, BL6, BL10, BL14, BL18 and BL22 are connected to cells in an adjacent row of cells, adjacent to the first row at the right hand edge. BL3, BL7, BL11, BL15, BL19 and BL23 are connected to cells in a first row of cells at the left hand edge of each region. BL1, BL5, BL9, BL13, BL17 and BL21 are connected to cells in an adjacent row of cells, adjacent to the first row at the left hand edge.

Figure 8A:
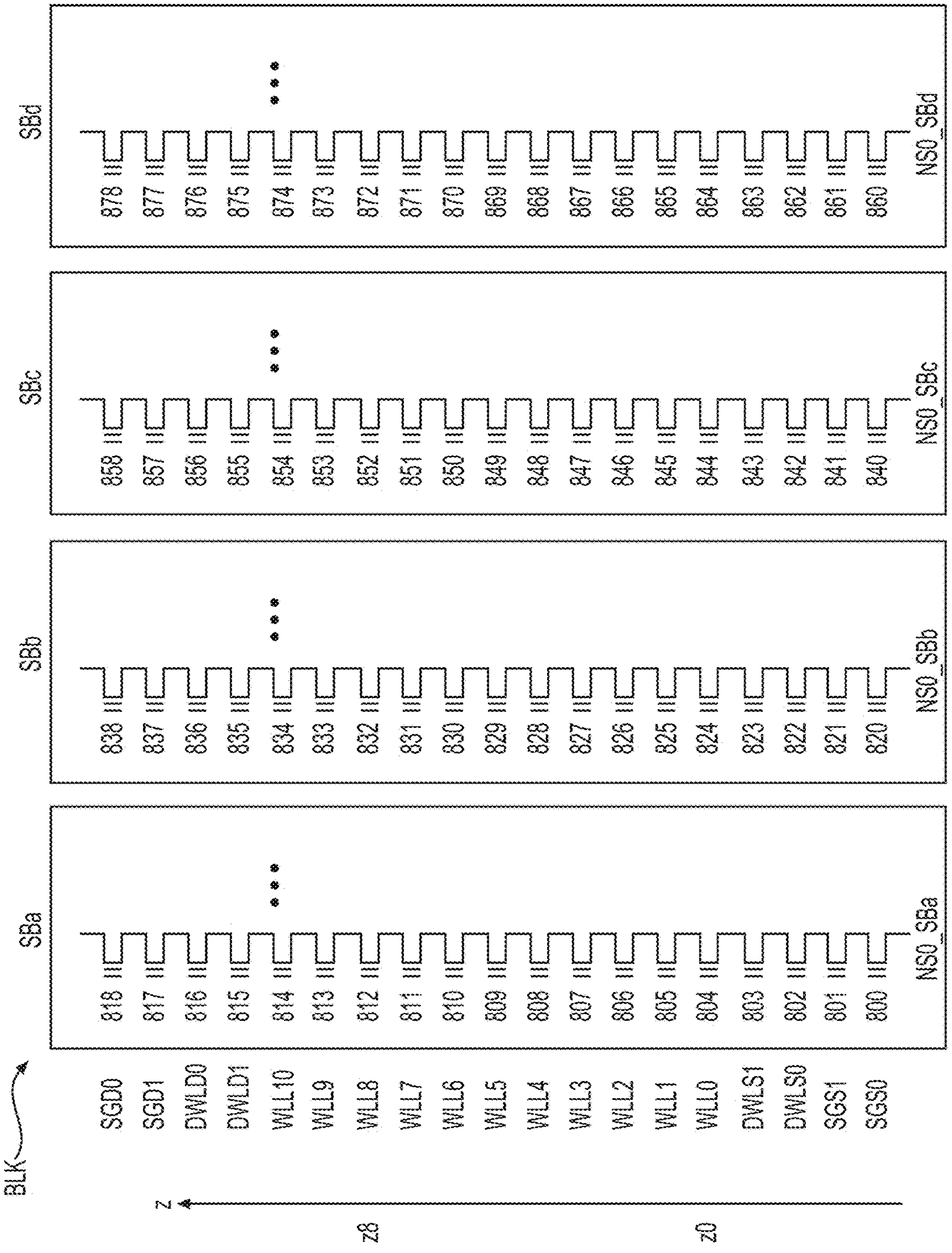
FIG. 8A depicts example NAND strings in the sub-blocks SBa-SBd of FIG. 7A according to aspects of the disclosure.

FIG. 8A depicts example NAND strings in the sub-blocks SBa-SBd of FIG. 7A. The sub-blocks are consistent with the structure of FIG. 6B. The conductive layers in the stack are depicted for reference at the left hand side. Each sub-block includes multiple NAND strings, where one example NAND string is depicted. For example, SBa comprises an example NAND string NS0_SBa, SBb comprises an example NAND string NS0_SBb, SBc comprises an example NAND string NS0_SBc, and SBd comprises an example NAND string NS0_SBd.

Additionally, NS0_SBa include SGS transistors 800 and 801, dummy memory cells 802 and 803, data memory cells 804, 805, 806, 807, 808, 809, 810, 811, 812, 813 and 814, dummy memory cells 815 and 816, and SGD transistors 817 and 818.

NS0_SBb include SGS transistors 820 and 821, dummy memory cells 822 and 823, data memory cells 824, 825, 826, 827, 828, 829, 830, 831, 832, 833 and 834, dummy memory cells 835 and 836, and SGD transistors 837 and 838.

NS0_SBc include SGS transistors 840 and 841, dummy memory cells 842 and 843, data memory cells 844, 845, 846, 847, 848, 849, 850, 851, 852, 853 and 854, dummy memory cells 855 and 856, and SGD transistors 857 and 858.

NS0_SBd include SGS transistors 860 and 861, dummy memory cells 862 and 863, data memory cells 864, 865, 866, 867, 868, 869, 870, 871, 872, 873 and 874, dummy memory cells 875 and 876, and SGD transistors 877 and 878.

At a given height in the block, a set of memory cells in each sub-block are at a common height. For example, one set of memory cells (including the memory cell 804) is among a plurality of memory cells formed along tapered memory holes in a stack of alternating conductive and dielectric layers. The one set of memory cells is at a particular height z0 in the stack. Another set of memory cells (including the memory cell 824) connected to the one word line (WLL0) are also at the particular height. In another approach, the set of memory cells (e.g., including the memory cell 812) connected to another word line (e.g., WLL8) are at another height (z8) in the stack.

Figure 8B:
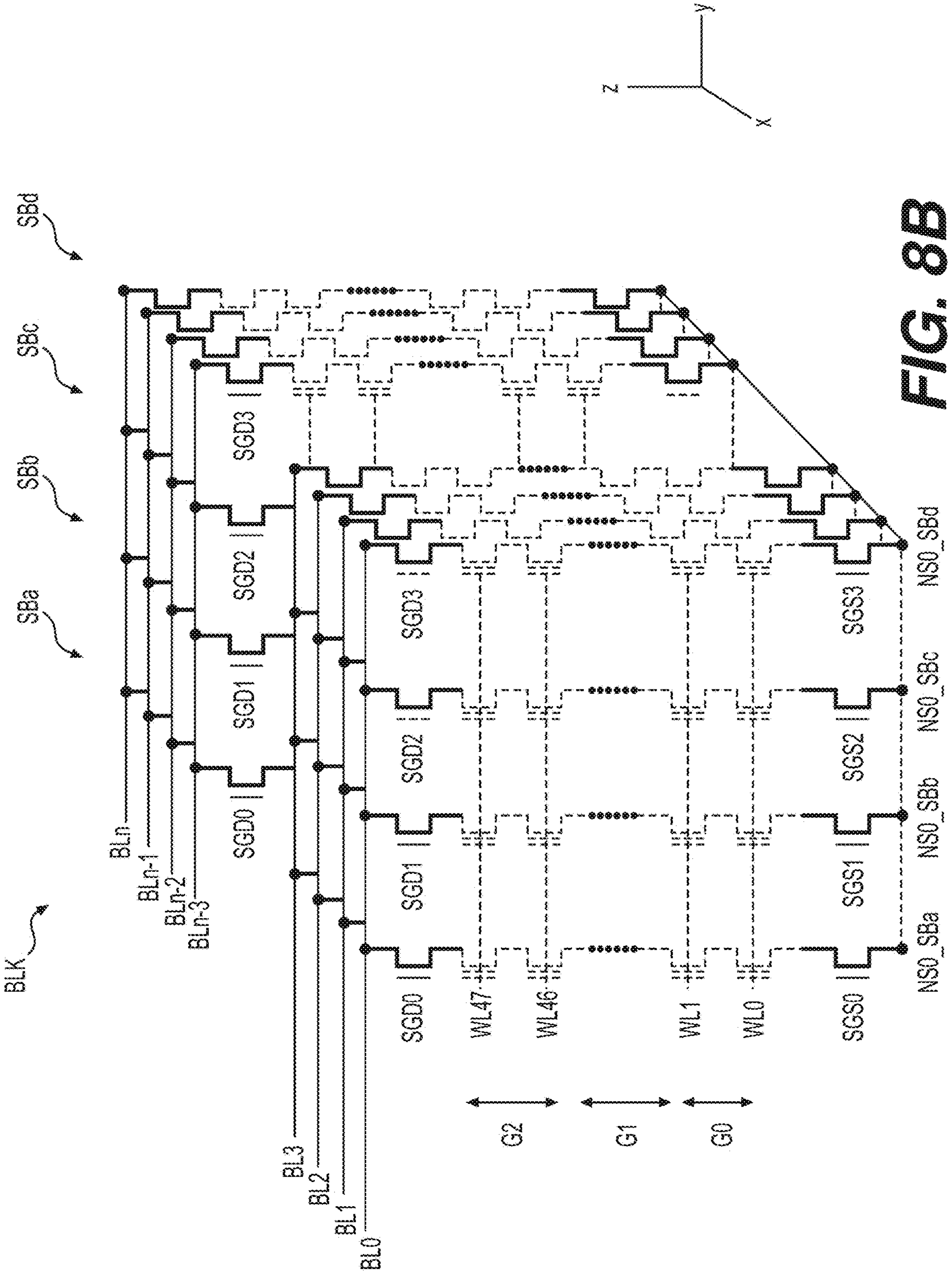
FIG. 8B depicts another example view of NAND strings in sub-blocks according to aspects of the disclosure.

FIG. 8B depicts another example view of NAND strings in sub-blocks. The NAND strings includes NS0_SBa, NS0_SBb, NS0_SBc and NS0_SBd, which have 48 word lines, WL0-WL47, in this example. Each sub-block comprises a set of NAND strings which extend in the x direction and which have a common SGD line, e.g., SGD0, SGD1, SGD2 or SGD3. In this simplified example, there is only one SGD transistor and one SGS transistor in each NAND string. The NAND strings NS0_SBa, NS0_SBb, NS0_SBc and NS0_SBd are in sub-blocks SBa, SBb, SBc and SBd, respectively. Further, example, groups of word lines G0, G1 and G2 are depicted.

Figure 8C:
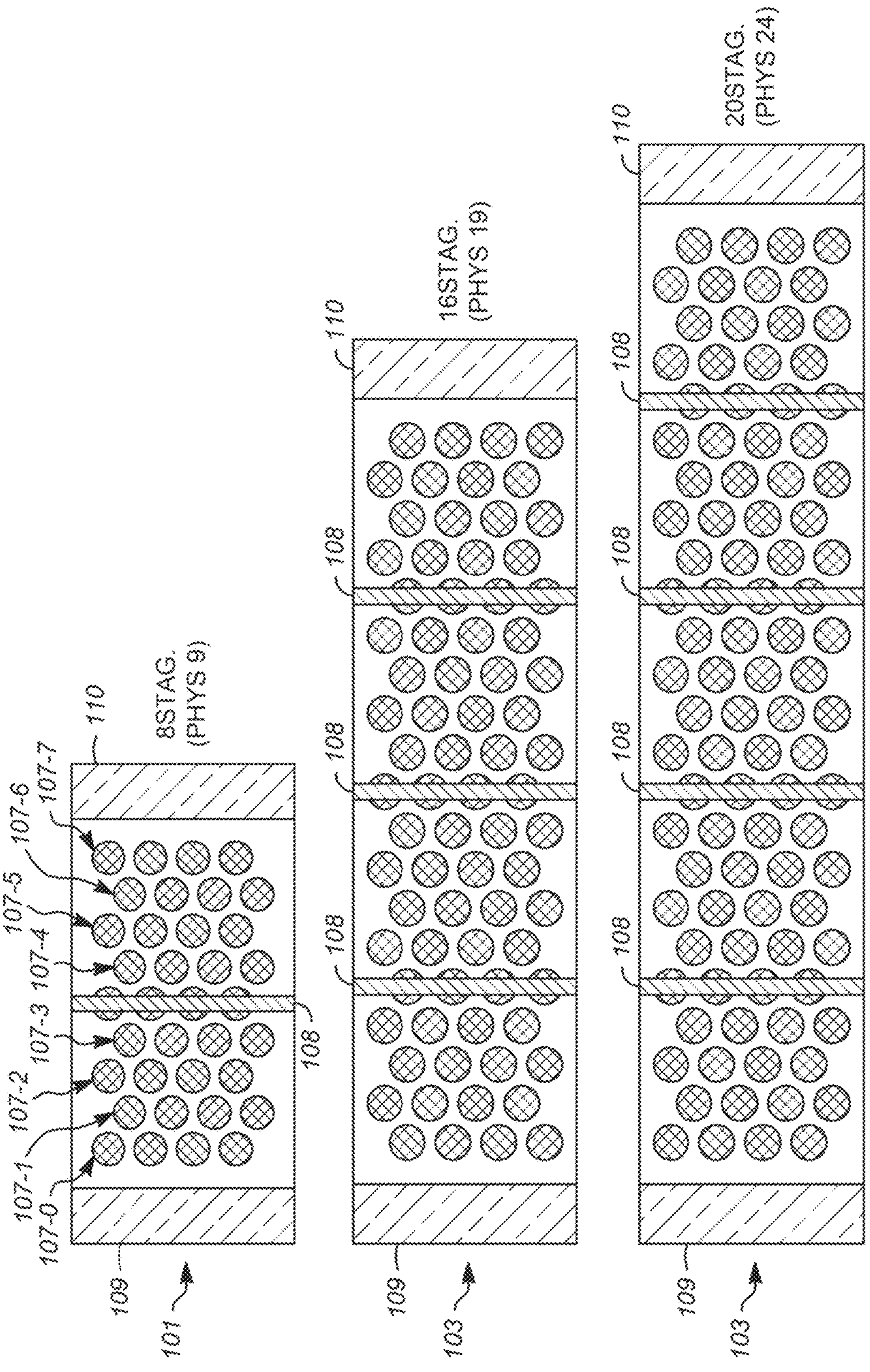
FIG. 8C depicts a top view of example word line layers of a stack according to aspects of the disclosure.

FIG. 8C generally illustrates a schematic view of three versions of staggered string architecture 101, 103, 105 for BiCS memory, e.g., NAND. With reference the string architecture 101, the strings are shown in rows 107-0 through 107-7 in architecture 101. Each row is shown with four ends to the strings. A string may be connected to an adjacent string at an end (not visible beneath this view). A first group of rows 107-0 through 107-3 are shown on a left side of a dummy row 108. A second group of rows 107-4 through 107-7 are shown on a right side of the dummy row 108. The dummy row 108 separates the two groups of rows in the staggered eight row. A source line 109 is positioned at an edge of the first group and is remote from the dummy row 108. A source line 110 is positioned at an edge of the second group and is remote from the dummy row 108 and source line 109.

The staggered string architectures 103, 105 for BiCS memory are similar to that of architecture 101 except additional groups are added. Architecture 103 is double the size of architecture 101 and includes sixteen rows of strings with each group of four rows separated by a dummy row. Architecture 105 is larger than both the architecture 101 and the architecture 103. Architecture 105 includes twenty rows of strings with each group of four rows separated by a dummy row 108.

These architectures 101, 103, 105 can include a chip under array structure, e.g., the control circuitry is under the memory array that can include the groups of memory strings. With the chip under array structure, the strings may include a direct strap contact for the source line for read and erase operations.

When a memory cell is programmed, NWI from a neighboring memory cell may cause a Vth distribution to shift and widen. For example, with conventional full sequence programming, after PD, NWI will cause a memory cell with a neighbor (e.g., WLn+1) in high states to have higher Vth and a memory cell with a neighbor in low states to have a lower Vth, thereby widening the Vth distribution of the data state. After HTDR, Vth shifts down even more for memory cells with low state neighbors (e.g., either WLn+1 or WLn−1) as compared with memory cells with high state neighbors due to lateral DR.

As previously described, in order to maintain effective data information and minimize FBC, conventional methodologies employed during read operations to compensate for DR loss include applying different read pass voltage (VREADK) values at WLn+1 or applying different read voltage (VCG) values at WLn (the selected word line). A different VREADK or VCG value may be applied to each "zone" of a plurality of zones to modulate WLn Vth distribution positions. The zones are formed based on data states of neighboring memory cells of WLn+1. WLn+1 may be read before performing a read operation on WLn to get WLn+1 state information. This helps to tighten Vth distributions. VREADK can also be used to compensate for device variations for different WL-WL distance.

The bias conditions for the word lines during a read operation may include the selected word line WLn receiving the read voltage VCGR which may be applied at one of the read compare levels. Further, word lines WLn−1 and WLn+1, which are adjacent to the selected word line WLn, receive a read pass voltage, VREADK, and the remaining word lines receive a read pass voltage, VREAD. VREAD is a read pass voltage applied at a level sufficient to turn on a cell in any of the programmed states. For example, VREAD may be applied at a level above the highest expected threshold voltage of a memory cell in the highest programmed state. VREADK is also a read pass voltage that is applied to turn on a memory cell in any programmed state. VREADK may be applied at a level higher than VREAD to compensate for a lower voltage at the adjacent word lines due to the lower VCGR voltages being applied to the selected word line. The remaining word lines are each adjacent to another word line receiving the VREAD voltage. In some instances, VREADK may be equal to VREAD.

Grouping techniques used in the implementation of conventional methodologies referenced above are not optimal. In particular, these methodologies only account for WLn+1 in identifying zones. For example, FIGS. 12A and 12B provide exemplary representations of zones identified for a one-bit and a two-bit read. The zones depicted in FIGS. 12A and 12B are identified based on WLn+1 data states and do not account for the data states of memory cells of WLn−1. For example, in FIG. 12A, data states 'Er' to 'D' of WLn+1 are defined as zone one with all data states of WLn−1. Also, in FIG. 12A, data states 'E' to 'G' of WLn+1 are defined as zone two with all data states of WLn−1. However, WLn+1/WLn/WLn−1 data state combinations 'Er'/X/'Er' and 'G'/X/'G' should not be grouped within one zone because WLn+1/WLn/WLn−1 as 'Er'/X/'Er' would have a strong lateral e-field to extract charges away from a victim state (where 'Er'/X/'Er' may constitute a lower tail); whereas WLn+1/WLn/WLn−1 as 'G'/X/'G' may constitute an upper tail and donate charges to the victim. For example, as seen in FIG. 12A, reliance solely on WLn+1 data states to identify zones may allow for data state combinations such as 'Er'/'Er' for WLn+1/WLn−1 to be in the same zone as 'D'/'G' for WLn+1/WLn−1. Similarly, as seen in FIG. 12B, data state combinations such as 'Er'/'Er' for WLn+1/WLn−1 may be in the same zone as 'A'/'G' for WLn+1/WLn−1 of the four zones depicted in FIG. 12B. By including such data state combinations in a same zone, the Vth distribution may be widened and limit the lowest VREADK that may be applied.

FIG. 13A illustrates example graphical representations of an overall Vth distribution 1302 and four zones identified within the overall Vth distribution based on data states of memory cells of a neighboring word line (e.g., WLn+1). As shown in FIG. 13B, during a read of WLn, applying different read pass voltage (VREADK) values at WLn+1 or applying different read voltage (VCG) values at WLn (the selected word line) may align the zones to the middle. A different VREADK or VCG value may be applied to each zone of a plurality of zones to modulate WLn Vth distribution positions. By grouping certain data state combinations (e.g., 'Er'/'Er' and 'G'/'G') into the same zone, can cause zone distributions to be wide and thereby, cause an overall Vth distribution to be wide when the zones are aligned to compensate for NWI and lateral DR effects.

To address the above, embodiments described herein are directed to a look neighbor ahead (LNA) pre-read that forms the most similar memory cells into one zone such that the final Vth distribution is tighter after alignment. The look neighbor ahead (LNA) pre-read method includes reading state information of both WLn+1 and WLn−1 before reading WLn and classifying combinations of data states of memory cells of WLn+1 and WLn−1 into different zones. Each zone may correspond to a data retention compensation scheme and a read operation may be performed on WLn including applying each data retention compensation scheme corresponding to any zones identified. In accordance with embodiments described herein, the LNA pre-read may include either first reading logical WLn+1 and subsequently reading logical WLn−1 for any bits read or first reading logical WLn−1 and subsequently reading logical WLn+1 for any bits read. In some embodiments, the LNA pre-read may include reading logical WLn+1 and logical WLn−1 at the same for any bits read.

To explore the foregoing in further detail FIG. 14 will now be described. FIG. 14 is a flowchart of a method 1400 for performing a look neighbor ahead pre-read. In some embodiments, method 1400 may be implemented by a controller, control circuitry, a processor, and/or the like, as described elsewhere herein. As shown in FIG. 14, method 1400 begins at a step 1402. At step 1402, data states are determined for a first set of memory cells of a first neighboring word line of the set of word lines and a second set of memory cells of a second neighboring word line of the set of word lines, where each of the data states are any of a plurality of data states that the first set and second set of memory cells are configured to store. The first and the second neighboring word lines are adjacent to a selected word line of the set of word lines. For example, assuming for illustration purposes WLL1 in FIG. 8A is the selected word line, a controller, such as sense circuit controller 560 described in FIG. 4A or controller 122 described in FIG. 1A, may determine data states for memory cells 806, 826, 846, and 866 (of word line WLL2) that neighbor memory cells 805, 825, 845, 865 of selected word line WLL1 and determine data states for memory cells 804, 824, 844, and 864 (of word line WLL0) that neighbor memory cells 805, 825, 845, 865 of selected word line WLL1.

More specifically, the controller may identify the data states of the memory cells included in each respective neighboring word line by performing one or more read operations (sometimes referred to as sense operations). The controller may, for example, perform a read operation to identify a data state of a memory cell of a physical neighboring word line (e.g., WLn−1, WLn+1, etc.) of a word line (e.g., WLn) by referencing a data structure supported by a data state latch (e.g., data state latch 548). The data structure may be used to store data state values for bits of neighboring memory cells (e.g., memory cells that are in the physical neighboring word lines). A data state may include an erased data state indicating that one or more bits of a memory cell have not been programmed or a programmed data state indicating that the one or more bits have been programmed (e.g., to a value of zero or one). Using a 3-bit memory cell architecture as an example, there may be one data state left in an erased data state ER and seven higher (or programmed) data states (represented by data state A, data state B, . . . , data state G).

In some embodiments, performing a read operation may include identifying one or more data states for a memory cell of the physical neighboring word line. In some embodiments, performing the read operation may include identifying data states for multiple memory cells of the physical neighboring word line. In some embodiments, performing the read operation may include identifying data states for multiple memory cells of multiple neighboring word lines (e.g., the physical neighboring WLn−1, the second neighboring word line WLn+1, etc.).

In some embodiments, determining data states for the first set of memory cells of a first neighboring word line and a second set of memory cells of a second neighboring word line includes reading state information of both WLn+1 and WLn−1 before reading WLn. In some embodiments, determining data states for the first set of memory cells of a first neighboring word line and a second set of memory cells of a second neighboring word line may include either first reading logical WLn+1 and subsequently reading logical WLn−1 for any bits read or first reading logical WLn−1 and subsequently reading logical WLn+1 for any bits read. For example, a pre-read may be perform for WLn+1 at verify levels BR/DR/FR and the reading results may be stored into two bit data latch and then a pre-read may be perform for WLn−1 at verify levels BR/DR/FR and the reading results may be stored into two bit data latch. An arbitrary CMOS data latch operation may be performed to compress the four bits DL into two bits DL for a four zone definition. As another example, in the scenario of eight states, pre-read may be performed including reading along for WLn+1 seven times and then reading along for WLn−1 seven times. The reading information may be collected and stored into a data ledge. The reading information may include seven bits information for WLn+1 and WLn−1. CMOS logic may be used to combine the information into one zone.

In some embodiments, determining data states for the first set of memory cells of a first neighboring word line and a second set of memory cells of a second neighboring word line may include reading logical WLn+1 and logical WLn−1 at the same time for any bits read. For example, embodiments described herein include reading states of multiple word lines (e.g., WLn+1 and WLn−1) at the same time to group them into different zones. This may include applying the same verify level on WLn+1 and WLn−1 at the same time and applying VREAD on all other word lines. The simultaneous sensing of multiple word lines helps to save read time. In accordance with embodiments described herein, the simultaneous sensing of multiple word lines includes applying different read levels for different word lines (e.g., two word lines, three word lines or any amount of word lines) during the read process. In some embodiments, during the read process, a sensor amplifier detects a bitline current which turns on only when all word lines are conducting. That is, the threshold voltage of each word line is below each of the read levels applied respectively.

Figure 16:
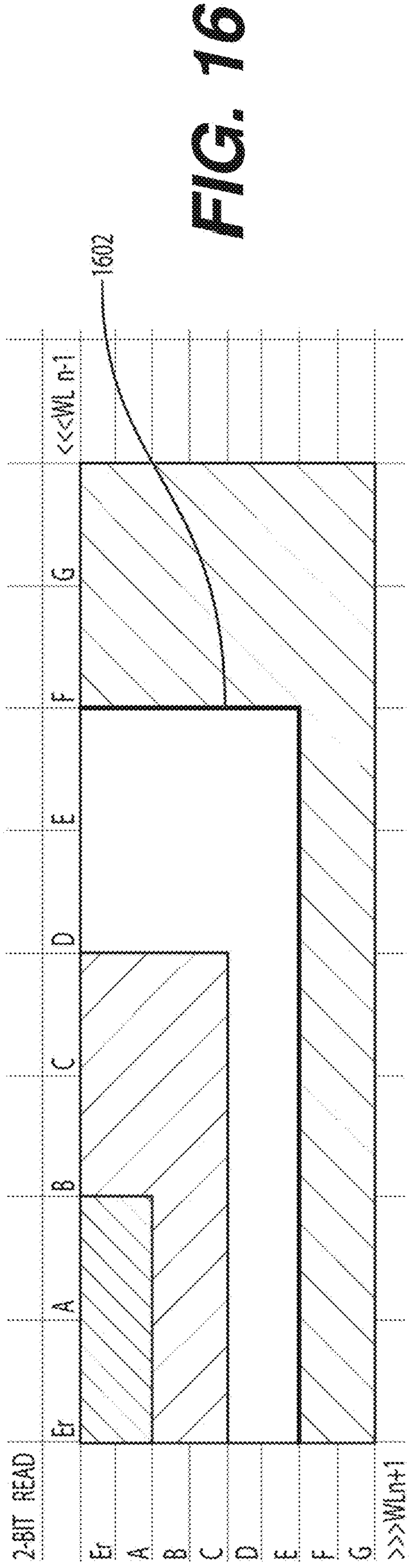

In some embodiments, the simultaneous sensing of multiple word lines may include dual word line sensing. For example, this may include dual word line sensing that pre-reads the logical WLn+1/WLn−1 at verify levels CR/ER/GR at the same time. Note the verify levels for WLn+1/WLn−1 may include some offset as compared to single WL read due to weaker turn on of dual WL sensing. The pre-read results are stored into two bit data latch, which may be used for a four zone definition. Each zone may contain threshold voltage information (in an L-shape) of the WLn+1 and WLn−1 (as shown in FIG. 16). To help further illustrate, WLn+1 and WLn−1 may be grouped together as one single cell to read and all other memory cells along the bitine are biased to VREADK. According to NAND logic, only if both cells are higher than a read level (e.g., 30 nA), then the bit-line is turned on.

Figure 17:
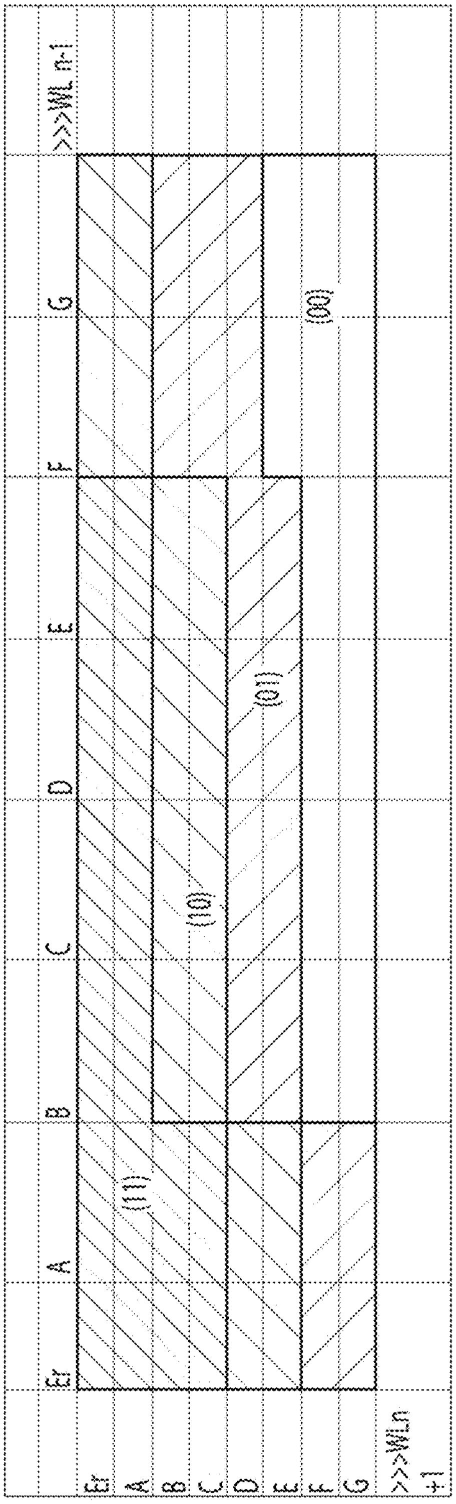
Figure 18:
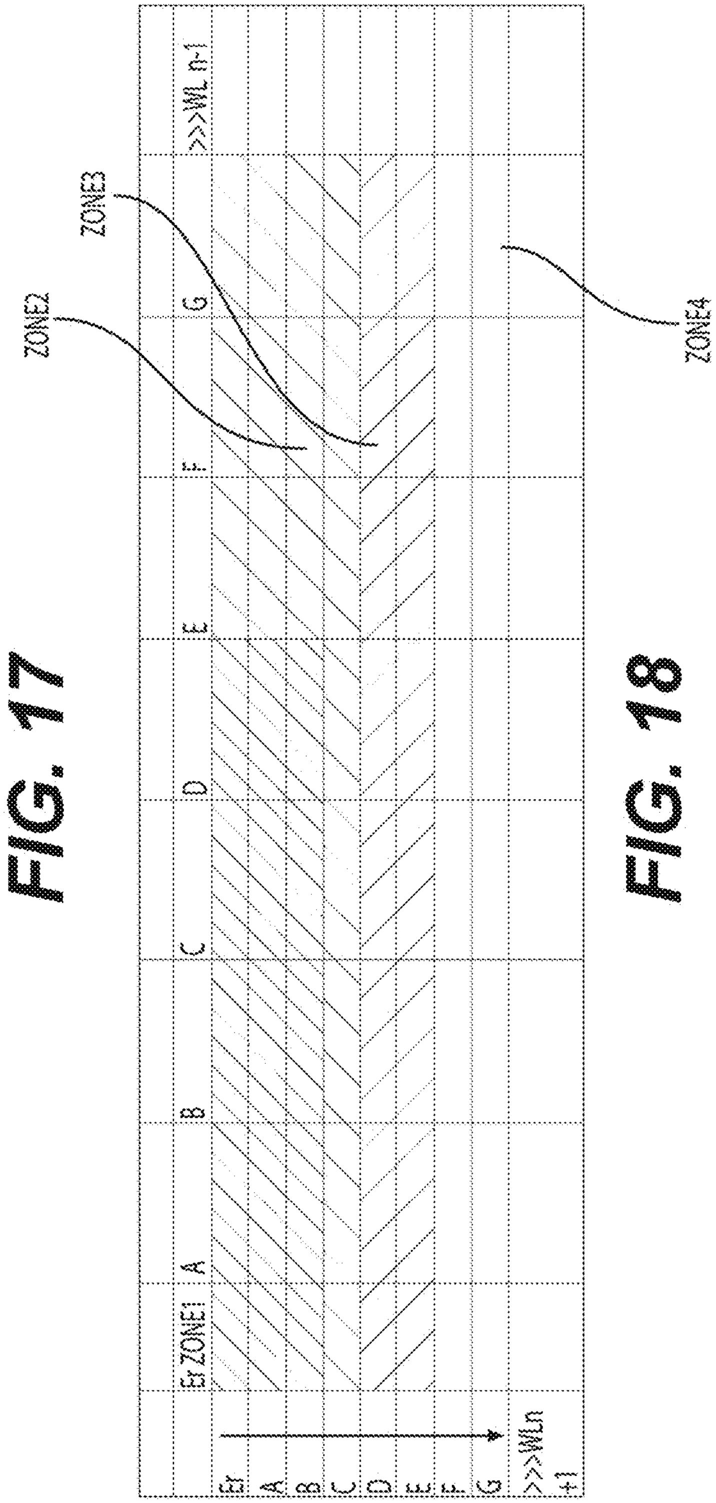

In some embodiments, WLn+1 and WLn−1 read level can be the same and symmetric when NWI impact is ignorable such as for reverse order programming and foggy-fine programming. In contrast, WLn+1 and WLn−1 read levels can be different to define borders between zones that form asymmetric zone shapes (as depicted in FIGS. 17 and 18) when there is NWI impact along WLn+1 direction. In accordance with embodiments disclosed herein, forming asymmetric zones may include applying verify levels CR/DR/FR at WLn+1 and applying verify levels ER/VREAD/VREAD at WLn−1 and applying a same VREAD at all other word lines. In this scenario, only when WLn+1 and WLn−1 are both passing a particular verify level, is there a chance that the bit line will turn on.

In FIG. 14, method 1400 further includes a step 1404. At step 1404, a zone of a plurality of zones is identified for each data state combination of the data states, where each data state combination comprises a data state of a memory cell of the first set of memory cells and a data state of a memory cell of the second set of memory cells and the memory cell of the first set of memory cells and the memory cell of the second set of memory cells being adjacent to a memory cell of a third set of memory cells of the selected word line. Each zone of the plurality of zones corresponds to a data retention compensation scheme.

For example, assuming for illustration purposes WLL1 in FIG. 8A is the selected word line, a controller, such as sense circuit controller 560 described in FIG. 4A or controller 122 described in FIG. 1A, may identify zones for data state combinations for the determined data states for memory cells 806, 826, 846, and 866 of word line WLL2 and determined data states for memory cells 804, 824, 844, and 864 of word line WLL0. Each zone of the plurality of zones corresponds to a data retention compensation scheme. The data retention compensation scheme may be applied during one or more read operations to be performed on selected word line WLL1, such that data retention compensation schemes corresponding to each zone of the plurality of zones may be used to offset an interference that memory cells 806, 826, 846, and 866 of word line WLL2 and 804, 824, 844, and 864 of word line WLL0 would otherwise have on memory cells 805, 825, 845, 865 of selected word line WLL1. In some embodiments, for example, WLn+1/WLn−1 is treated as one single current read, when current is above or below a certain level, the corresponding WLn+1 and WLn−1 combination is classified into one zone.

Figure 15:
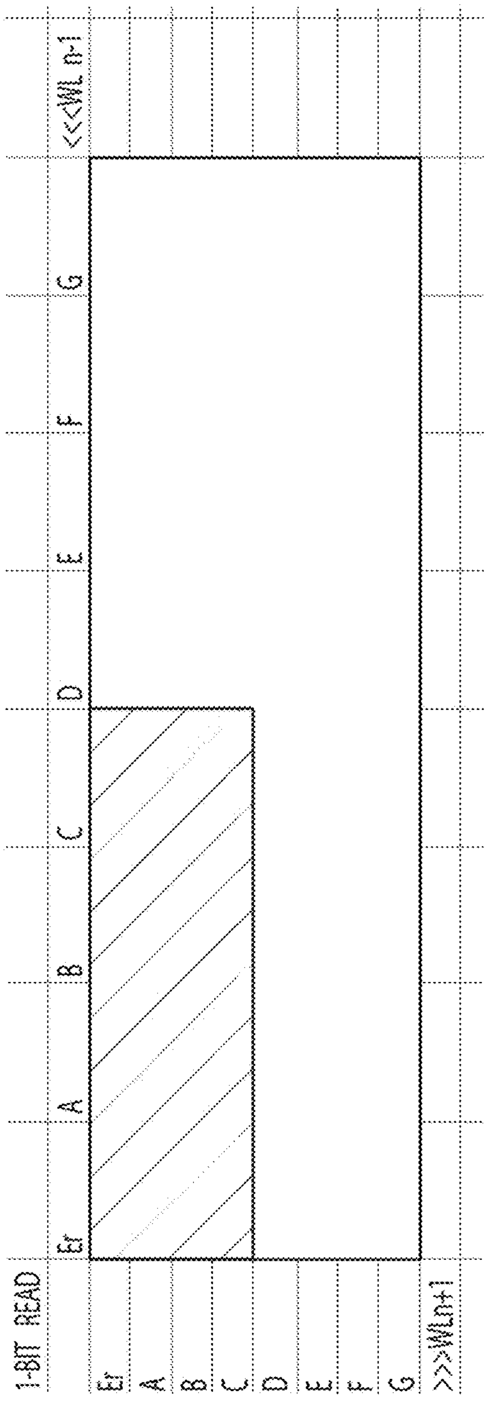

FIGS. 15 and 16 provide an exemplary table of zone mappings. As shown in the table of FIG. 15, for example, data states 'Er', 'A', 'B', and 'C' of a neighboring memory cell of WLn+1 and data states 'Er', 'A', 'B', and 'C' of a neighboring memory cell of WLn−1 are mapped to a first zone and data states 'D', 'E', 'F', and 'G' of a neighboring memory cell of WLn+1 and 'D', 'E', 'F', and 'G' of a neighboring memory cell of WLn−1 are mapped to a second zone. The border shape may take any shape (e.g., diagonal, L-shaped, etc.).

As another example, the table of FIG. 16 depicts data states 'Er' and 'A' of a neighboring memory cell of WLn+1 and data states 'Er' and 'A' of a neighboring memory cell of WLn−1 mapped to a first zone. Data states 'B' and 'C' of a neighboring memory cell of WLn+1 and data states 'B' and 'C' of a neighboring memory cell of WLn−1 mapped to a second zone. Data states 'D' and 'E' of a neighboring memory cell of WLn+1 and data states 'D' and 'E' of a neighboring memory cell of WLn−1 mapped to a third zone. Data states 'F' and 'G' of a neighboring memory cell of WLn+1 and data states 'F' and 'G' of a neighboring memory cell of WLn−1 mapped to a fourth zone. As shown in FIG. 16, a border 1602 separates two neighbor zones (i.e., the third zone and the fourth zone).

In some embodiments, WLn+1 and WLn−1 read level can be the same and symmetric when NWI impact is ignorable such as for reverse order programming and foggy-fine programming. For example, as depicted in FIG. 16, a pre-read may be perform for WLn+1 at verify levels BR/DR/FR and the reading results may be stored into two bit data latch and then a pre-read may be perform for WLn−1 at verify levels BR/DR/FR and the reading results may be stored into two bit data latch. An arbitrary CMOS data latch operation may be performed to compress the four bits DL into two bits DL for a four zone definition.

In contrast, WLn+1 and WLn−1 read levels can be different to define borders between zones that form asymmetric zone shapes (as depicted in FIGS. 17 and 18) when there is NWI impact along WLn+1 direction, as well as lateral DR impact along the diagonal direction. For example, the table of FIG. 17 depicts a diagonal grouping of data state combinations that are mapped to four zones. As depicted in FIG. 17, different combinations of data states of a neighboring memory cell of WLn+1 and data states of a neighboring memory cell of WLn−1 are mapped to four different zones. For example, a combination of data state 'Er' of a neighboring memory cell of WLn+1 and data state 'Er' of a neighboring memory cell of WLn−1 map to a first zone. As another example, a combination of data state 'D' of a neighboring memory cell of WLn+1 and data state 'Er' of a neighboring memory cell of WLn−1 map to a second zone.

For example, the table of FIG. 17 depicts a horizontal and L-shape grouping of data state combinations that are mapped to four zones. These asymmetric zones may be identified by applying verify levels CR/DR/FR at WLn+1 and applying verify levels ER/VREAD/VREAD at WLn−1 and applying a same VREAD at all other word lines. In this scenario, only when WLn+1 and WLn−1 are both passing a particular verify level, is there a chance that the bit line will turn on.

As further shown in FIG. 14, method 1400 includes a step 1406. At step 1406, a read operation is performed on the selected word line including applying each data retention compensation scheme corresponding to any zones of the plurality of zones identified for the third set of memory cells of the selected word line. For example, assuming for illustration purposes WLL1 in FIG. 8A is the selected word line, a controller, such as sense circuit controller 560 described in FIG. 4A or controller 122 described in FIG. 1A, may perform a read operation on selected word line WLL1 applying each data retention compensation scheme corresponding to any zones of the plurality of zones identified when performing a read process on memory cells 805, 825, 845, 865 of WLL1.

In some embodiments, the data retention compensation scheme may include, during the read process for a selected word line (WLn), applying different read pass voltage (VREADK) values at WLn+1 for each zone (e.g., VREADK 8.1V for zone one, VREADK 8.7V for zone two, VREADK 9.1V for zone three, and VREADK 9.7V for zone four).

As discussed above, pre-reads of WLn+1 and WLn−1 may be completed before every page read. FIG. 19 shows a read operation in which a first neighboring word line (WLn+1) is read before each page (i.e., employing a DLA technique). FIG. 20 shows a read operation in which the first neighboring word line (WLn+1) and second neighboring word line (WLn−1) are read before each page (i.e., employing a NLA technique). Again, zones may be defined based on groupings of the data states of the memory cells of the neighboring word lines WLn+1, WLn−1. Nevertheless, while DLA and LNA can provide better threshold voltage margin, existing zoning methods do not always provide the read accuracy desired. In a typical fast LNA method, a pre-read is done using fast single-level cell (SLC) method with RCLK timing, the reference level is set by a FLNA_READ parameter, in the case shown at the top portion of FIG. 27, for example, the D state is set as reference level and hence the memory cell connected to WLn+1 being programmed to E, F, G state will be categorized into a second zone or zone 2. Then in actual reading, a first zone or zone 1 and zone 2 will access two different reads (intelligent quick pass write, iQPW) which uses same read voltage level with difference sense times, for example, if a bit is in zone 2, then sense time is adjusted by a delta sense time, otherwise the sense time is unchanged.

FIG. 21 is a plot of threshold voltage distributions when not using look neighbor ahead (LNA) when the memory cell of the first neighboring word line WLn+1 is randomly programmed as compared to programmed to the G data state. As shown, the threshold voltage of the memory cells shifts up when WLn+1 is at G state compared to that of random data states. FIG. 22 shows a selected memory cell along with neighboring memory cells connected to neighboring word lines and illustrates a programming order or direction. During programming in the example shown, WLn+1 is programmed after WLn. If WLn+1 is programmed to a higher state (such as G state), then when reading WLn, a voltage gate to source (VGS) loss occurs due to WLn+1 being at higher states will cause the threshold voltage of the memory cell connected to the selected word line WLn to read higher than that during program-verify. When WLn−1 is at G state, no threshold voltage shift is observed. So, referring back to FIG. 21, the whole threshold voltage distribution is upshifted due to WLn+1 being at G state. To account for this, the sense time can be increased to wait for the channel to be charged up, which lowers the sensed threshold voltage to compensate the increase threshold voltage due to high threshold voltage at WLn+1. FIG. 23 is a plot of a threshold voltage detected versus the sense time. Specifically, a sensing capacitor of a sense amplifier is charged up and allowed to leak out during a duration of the sense time. The amount of charge remaining at the sense time determined the threshold voltage detected. So, during sensing, the sensing capacitor is first charged up to a supply voltage VDD. Then, a bit line BL and XXL transistor are turned on which allows capacitor to discharge. The discharge equation can be expressed as T=C*VDD/Icell, where T is the discharge time. Here, the channel current Icell depends on transistor current, which in this case it is gated by VGS. Therefore when WLn+1 is in G state, VGS gets lower than Icell becomes smaller, which causes the capacitor to discharge slower and therefore sense a higher threshold voltage Vt.

FIG. 24 is a plot of a median threshold voltage of memory cells in the A data state versus the sense time when the memory cell of the first neighboring word line WLn+1 is programmed randomly, erased, in the D data state, and the G data state. When WLn+1 is at D state, the A state threshold voltage value is matched to that when WLn+1 is at random states. When WLn+1 is at G state, the A state threshold voltage value is increased by ~100 mV, which will require a 0.7 us increase in the sense time to compensate this threshold voltage increase. In contrast, when WLn+1 is at Er sate, the A state threshold voltage value is ~80 mV lower which requires a 0.4 us decrease in the sense time in order to compensate this threshold voltage decrease. FIG. 25 illustrates a delta sense time dependence on the data states of the first neighboring word line WLn+1 and the selected word line WLn. As shown, the delta sense time value can be obtained for each given WLn state and WLn+1 state. This phenomenon is purely due to VGS modulation, when WLn+1 is in higher states, potential on the source side will be higher, leading to a smaller VGS. When programming higher states on WLn, gate voltage will be higher, which leads to higher VGS.

In addition to a dependence on the WLn+1 state, the sense time is also dependent on temperature. FIGS. 26A and 26B illustrate the delta sense time dependence on the data states of the first neighboring word line WLn+1 and the selected word line WLn at two different temperatures, 25 degrees Celsius and 85 degrees Celsius. As shown, the sense time also depends on temperature. at high temperature (HT), this delta sense time will only need 0.2 us to match the same threshold voltage when WLn+1 is at G state, whereas at room temperature (RT) it requires as much as 1 us to match the same threshold voltage.

Consequently, described herein is a memory apparatus (e.g., memory device 100 in FIG. 1A) including memory cells (e.g., data memory cells 804, 805, 806, 807, 808, 809, 810, 811, 812, 813 and 814 of FIG. 8A) each connected to one of a plurality of word lines (e.g., WLL0-WLL10 of FIG. 8A). The memory cells are configured to retain a threshold voltage corresponding to one of a plurality of data states (e.g., erased or Er state and A, B, C data states of FIG. 9, erased or Er state and A, B, C, D, E, F and G data states of FIG. 10, and Er, 1, 2, 3, 4, 5, 6, 7, 8, 9, A, B, C, D, E and F data states of FIG. 11). The memory apparatus additionally includes a control means (e.g., control circuitry 110, controller 122, row decoder 124, read/write circuits 128, sense blocks SB1, SB2 . . . . SBp, and column decoder 132 in FIG. 1A) coupled to the plurality of word lines and the strings. The control means is configured to determine ones of the plurality of data states for the memory cells of a neighboring word line of the plurality of word lines adjacent to a selected word line of the plurality of word lines in a pre-read. The control means determines an adjusted sense time according to a zone of a plurality of zones identified for the memory cells of the neighboring word line adjacent each of the memory cells of the selected word line and the one of the plurality of data states targeted for the memory cells of the selected word line and a temperature of the memory apparatus. The control means is also configured to perform a plurality of reads on the selected word line for each of a plurality of groupings of ones of the plurality of data states in a read operation using the adjusted sense time determined for each of the memory cells of the selected word line.

Referring back to FIG. 6B, for example, the plurality of word lines (e.g., word line layers WLL0-WLL10) and a plurality of dielectric layers (e.g., dielectric layers DL5-DL14) extend horizontally and overlay one another in an alternating fashion in a stack (e.g., stack 610). Memory holes (e.g., NAND strings NS1 and NS2) extend vertically through the stack. The memory cells are connected in series between a drain-side select gate transistor (e.g., at SGD1 and/or SGD0 layers) on a drain-side of each of the memory holes and a source-side select gate transistor (e.g., at SGS1 and/or SGS0 layers) on a source-side of each of the memory holes. The drain-side select gate transistor of each of the strings is connected to one of a plurality of bit lines (e.g., bit line BL0) and the source-side select gate transistor of each of the strings is connected to a source line (e.g., substrate 611). Thus, according to an aspect, the neighboring word line WLn+1 (e.g., word line layer WLL5) is immediately adjacent to and disposed vertically above the selected word line (e.g., word line layer WLL4) in the stack. So, the zoning technique described herein is modified to be based on the selected word line WLn and the neighboring word line WLn+1 (i.e., the first neighboring word line), which is more accurate compared to zoning techniques using the first neighboring word line WLn+1 and the second neighboring word line WLn−1 (e.g., word line layer WLL3). Furthermore, based on this zoning correlation, the adjusted sense time is also based on temperature, which can further help improve the read accuracy of look neighbor ahead at different temperatures.

According to another aspect of the disclosure, the plurality of zones includes two zones. Specifically, the plurality of zones includes a first zone (Zone 1) corresponding with the memory cells of the neighboring word line having the threshold voltage associated with one group of the plurality of data states and a second zone (Zone 2) corresponding with the memory cells of the neighboring word line having the threshold voltage associated with another group of the plurality of data states. FIG. 27 shows a comparison of zone sensing in a look neighbor ahead approach utilizing data states of both the first neighboring word line (WLn+1) and the second neighboring word line (WLn−1) to define the zones (top portion of FIG. 27) to the look neighbor ahead approach described herein utilizing data states of selected word line (WLn) and the first neighboring word line (WLn+1) define the zones. Thus, instead of separating Zone 1 and Zone 2 by WLn+1 and WLn−1 states, the zones are separated by WLn and WLn+1 states. Specifically, since the second neighboring word line WLn−1 has only minor impact on threshold voltage shift compared to the selected word line WLn, the selected word line WLn is used. Referring back to FIG. 25, it is observed that WLn also has a strong dependency on the sense time. Based on this observation, the top portion of FIG. 27 can be regenerated by WLn/WLn+1 combination to result in the lower portion of FIG. 27, which will improve read accuracy without increasing read time tRead. Another bias on WLn−1 is also not required.

According to a further aspect, the memory apparatus includes a temperature determination circuit (e.g., part of the determination circuit 153 of FIG. 1B) configured to detect the temperature of the memory apparatus. So, the control means is further configured to determine the temperature of the memory apparatus using the temperature determination circuit. The control means calculates a first zone delta sense time DSEN2_X_Zone1 (*new*) (used to adjust the sense time) as a first zone sense coefficient DSEN2_X_Zone1 multiplied by a first zone sense temperature offset. The first zone sense temperature offset is equal to one plus a first zone temperature coefficient TCO_DSEN2_Zone1 multiplied by a first temperature offset equal to the temperature of the memory apparatus minus eighty five. The first zone sense coefficient DSEN2_X_Zone1 and the first zone temperature coefficient TCO_DSEN2_Zone1 are selected based on the one of the plurality of data states targeted for the memory cells of the selected word line. The control means also calculates a second zone delta sense time DSEN2_X_Zone2 (*new*) (used to adjust the sense time) as a second zone sense coefficient DSEN2_X_Zone2 multiplied by a second zone sense temperature offset TCO_DSEN2_Zone2. The second zone sense temperature offset is equal to one plus a second zone temperature coefficient TCO_DSEN2_Zone2 multiplied by a second temperature offset equal to the temperature of the memory apparatus minus eighty five. The second zone sense coefficient DSEN2_X_Zone2 and the second zone temperature coefficient TCO_DSEN2_Zone2 are selected based on the one of the plurality of data states targeted for the memory cells of the selected word line. The control means is additionally configured to determine the adjusted sense time for each one of the memory cells of the selected word line using the first zone delta sense time DSEN2_X_Zone1 (new) in response to one of the memory cells of the neighboring word line adjacent to the one of the memory cells of the selected word line having the threshold voltage associated with of the plurality of data states. The control means is also configured to determine the adjusted sense time for each one of the memory cells of the selected word line using the second zone delta sense time DSEN2_X_Zone2 (*new*) in response to the one of the memory cells of the neighboring word line adjacent to the one of the memory cells of the selected word line having the threshold voltage associated with the another group of the plurality of data states.

According to an aspect, data stored in the memory cells is stored as a plurality of lower bits of a lower page (e.g., LP of FIG. 28), a plurality of middle bits of a middle page (e.g., MP of FIG. 28), and a plurality of upper bits of an upper page (e.g., UP of FIG. 28) encoded with a code scheme. As discussed above, the plurality of data states includes, in order of the threshold voltage increasing in magnitude, an erased state (e.g., Er state of FIG. 10) and a first data state (e.g., A data state of FIG. 10), a second data state (e.g., B data state of FIG. 10), a third data state (e.g., C data state of FIG. 10), a fourth data state (e.g., D data state of FIG. 10), a fifth data state (e.g., E data state of FIG. 10), a sixth data state (e.g., F data state of FIG. 10), and a seventh data state (e.g., G data state of FIG. 10). The plurality of groupings of ones of the plurality of data states includes the lower page corresponding with the first data state and the fifth data state and the middle page corresponding with the second data state and the fourth data state and the sixth data state and the upper page corresponding with the third data state and the seventh data state. Thus, according to another aspect, the first zone corresponds with the memory cells of the neighboring word line having the threshold voltage associated with the erased state and the first data state and the second data state and the third data state and the fourth data state. The second zone corresponds with the memory cells of the neighboring word line having the threshold voltage associated with the fifth data state and the sixth data state and the seventh data state.

According to a further aspect, the memory apparatus can include a coefficient look up table including values of the first zone sense coefficient DSEN2_X_Zone1 and the first zone temperature coefficient TCO_DSEN2_Zone1 and the second zone sense coefficient DSEN2_X_Zone2 and the second zone temperature coefficient TCO_DSEN2_Zone2 for each one of the plurality of data states possible for the memory cells of the selected word line. FIG. 28 shows an example coefficient look up table along with equations used to calculate the first zone delta sense time DSEN2_X_Zone1 (*new*) and the second zone delta sense time DSEN2_X_Zone2 (*new*). So, the control means is configured to select the first zone sense coefficient DSEN2_X_Zone1 and the first zone temperature coefficient TCO_DSEN2_Zone1 from the coefficient look up table based on the one of the plurality of data states targeted for the memory cells of the selected word line and calculate the first zone delta sense time DSEN2_X_Zone1 (*new*) accordingly. The control means is also configured to select the second zone sense coefficient DSEN2_X_Zone2 and the second zone temperature coefficient TCO_DSEN2_Zone2 from the coefficient look up table based on the one of the plurality of data states targeted for the memory cells of the selected word line and calculate the second zone delta sense time DSEN2_X_Zone2 (*new*) accordingly.

The pre-read can be accomplished by adding iQPW (i.e., every sense involves a charging of a sense capacitor of a sense amplifier twice) or a fast quick pass write (fQPW) (i.e., every sense involves a charging of a sense capacitor of a sense amplifier once). FIG. 29 shows example timing for read operations including the pre-read. Hard bits (HB) and Soft bits (SB) are shown and are used as part of a correction method (load hard bit and soft bit into registers and compare). So, according to an aspect, the control means is further configured to apply a single read voltage corresponding to one of the plurality of data states to the selected word line while the memory cells associated with the first zone and the memory cells associated with the second zone are read in turn using the adjusted sense time during the plurality of reads.

Now referring to FIG. 30, a method of operating a memory apparatus is also provided. As discussed above, the memory apparatus (e.g., memory device 100 in FIG. 1A) includes memory cells (e.g., data memory cells 804, 805, 806, 807, 808, 809, 810, 811, 812, 813 and 814 of FIG. 8A) each connected to one of a plurality of word lines (e.g., WLL0-WLL10 of FIG. 8A). The memory cells are configured to retain a threshold voltage corresponding to one of a plurality of data states (e.g., erased or Er state and A, B, C data states of FIG. 9, erased or Er state and A, B, C, D, E, F and G data states of FIG. 10, and Er, 1, 2, 3, 4, 5, 6, 7, 8, 9, A, B, C, D, E and F data states of FIG. 11). So, the method includes the step of 3000 determining ones of the plurality of data states for the memory cells of a neighboring word line of the plurality of word lines adjacent to a selected word line of the plurality of word lines in a pre-read. The method continues with the step of 3002 determining an adjusted sense time according to a zone of a plurality of zones identified for the memory cells of the neighboring word line adjacent each of the memory cells of the selected word line and the one of the plurality of data states targeted for the memory cells of the selected word line and a temperature of the memory apparatus. The method also includes the step of 3004 performing a plurality of reads on the selected word line for each of a plurality of groupings of ones of the plurality of data states in a read operation using the adjusted sense time determined for each of the memory cells of the selected word line.

Again, referring back to FIG. 6B, for example, the plurality of word lines (e.g., word line layers WLL0-WLL10) and a plurality of dielectric layers (e.g., dielectric layers DL5-DL14) extend horizontally and overlay one another in an alternating fashion in a stack (e.g., stack 610). Memory holes (e.g., NAND strings NS1 and NS2) extend vertically through the stack. The memory cells are connected in series between a drain-side select gate transistor (e.g., at SGD1 and/or SGD0 layers) on a drain-side of each of the memory holes and a source-side select gate transistor (e.g., at SGS1 and/or SGS0 layers) on a source-side of each of the memory holes. The drain-side select gate transistor of each of the strings is connected to one of a plurality of bit lines (e.g., bit line BL0) and the source-side select gate transistor of each of the strings is connected to a source line (e.g., substrate 611). Therefore, according to an aspect, the neighboring word line WLn+1 (e.g., word line layer WLL5) is immediately adjacent to and disposed vertically above the selected word line (e.g., word line layer WLL4) in the stack.

Referring back to the lower portion of FIG. 27 and according to a further aspect of the disclosure, the plurality of zones includes two zones. As above, the plurality of zones includes a first zone (Zone 1) corresponding with the memory cells of the neighboring word line having the threshold voltage associated with one group of the plurality of data states and a second zone (Zone 2) corresponding with the memory cells of the neighboring word line having the threshold voltage associated with another group of the plurality of data states.

As discussed above and according to a further aspect, the memory apparatus includes a temperature determination circuit (e.g., part of the determination circuit 153 of FIG. 1B) configured to detect the temperature of the memory apparatus. Accordingly, the method can further include the step of determining the temperature of the memory apparatus using the temperature determination circuit. The method can continue with the step of calculating a first zone delta sense time DSEN2_X_Zone1 (*new*) as a first zone sense coefficient DSEN2_X_Zone1 multiplied by a first zone sense temperature offset. The first zone sense temperature offset is equal to one plus a first zone temperature coefficient TCO_DSEN2_Zone1 multiplied by a first temperature offset equal to the temperature of the memory apparatus minus eighty five. The first zone sense coefficient DSEN2_X_Zone1 and the first zone temperature coefficient TCO_DSEN2_Zone1 are selected based on the one of the plurality of data states targeted for the memory cells of the selected word line. The next step of the method is calculating a second zone delta sense time DSEN2_X_Zone2 (*new*) as a second zone sense coefficient DSEN2_X_Zone2 multiplied by a second zone sense temperature offset. The second zone sense temperature offset is equal to one plus a second zone temperature coefficient TCO_DSEN2_Zone2 multiplied by a second temperature offset equal to the temperature of the memory apparatus minus eighty five. The second zone sense coefficient DSEN2_X_Zone2 and the second zone temperature coefficient TCO_DSEN2_Zone2 selected based on the one of the plurality of data states targeted for the memory cells of the selected word line. The method may additionally include the step of determining the adjusted sense time for each one of the memory cells of the selected word line using the first zone delta sense time DSEN2_X_Zone1 (*new*) in response to one of the memory cells of the neighboring word line adjacent to the one of the memory cells of the selected word line having the threshold voltage associated with the one group of the plurality of data states. The method can also include the step of determining the adjusted sense time for each one of the memory cells of the selected word line using the second zone delta sense time DSEN2_X_Zone2 (*new*) in response to the one of the memory cells of the neighboring word line adjacent to the one of the memory cells of the selected word line having the threshold voltage associated with the another group of the plurality of data states.

As discussed, data stored in the memory cells is stored as a plurality of lower bits of a lower page (e.g., LP of FIG. 28), a plurality of middle bits of a middle page (e.g., MP of FIG. 28), and a plurality of upper bits of an upper page (e.g., UP of FIG. 28) encoded with a code scheme. Again, the plurality of data states includes, in order of the threshold voltage increasing in magnitude, an erased state (e.g., Er state of FIG. 10) and a first data state (e.g., A data state of FIG. 10), a second data state (e.g., B data state of FIG. 10), a third data state (e.g., C data state of FIG. 10), a fourth data state (e.g., D data state of FIG. 10), a fifth data state (e.g., E data state of FIG. 10), a sixth data state (e.g., F data state of FIG. 10), and a seventh data state (e.g., G data state of FIG. 10). The plurality of groupings of ones of the plurality of data states includes the lower page corresponding with the first data state and the fifth data state and the middle page corresponding with the second data state and the fourth data state and the sixth data state and the upper page corresponding with the third data state and the seventh data state. Therefore, according to another aspect, the first zone corresponds with the memory cells of the neighboring word line having the threshold voltage associated with the erased state and the first data state and the second data state and the third data state and the fourth data state. The second zone corresponds with the memory cells of the neighboring word line having the threshold voltage associated with the fifth data state and the sixth data state and the seventh data state.

Again, with reference back to FIG. 28, the memory apparatus can include a coefficient look up table including values of the first zone sense coefficient DSEN2_X_Zone1 and the first zone temperature coefficient TCO_DSEN2_Zone1 and the second zone sense coefficient DSEN2_X_Zone2 and the second zone temperature coefficient TCO_DSEN2_Zone2 for each one of the plurality of data states possible for the memory cells of the selected word line. Thus, the method can further include the step of selecting the first zone sense coefficient DSEN2_X_Zone1 and the first zone temperature coefficient TCO_DSEN2_Zone1 from the coefficient look up table based on the one of the plurality of data states targeted for the memory cells of the selected word line and calculate the first zone delta sense time DSEN2_X_Zone1 (*new*) accordingly. The method also may include the step of selecting the second zone sense coefficient DSEN2_X_Zone2 and the second zone temperature coefficient TCO_DSEN2_Zone2 from the coefficient look up table based on the one of the plurality of data states targeted for the memory cells of the selected word line and calculate the second zone delta sense time DSEN2_X_Zone2 (*new*) accordingly.

Once again referring back to FIG. 29, the pre-read can be accomplished by adding iQPW (i.e., every sense involves a charging of a sense capacitor of a sense amplifier twice) or a fast quick pass write (fQPW) (i.e., every sense involves a charging of a sense capacitor of a sense amplifier once). Thus, according to an aspect, the method can further include the step of applying a single read voltage corresponding to one of the plurality of data states to the selected word line while the memory cells associated with the first zone and the memory cells associated with the second zone are read in turn using the adjusted sense time during the plurality of reads.

Clearly, changes may be made to what is described and illustrated herein without, however, departing from the scope defined in the accompanying claims. The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The terminology used herein is for the purpose of describing particular example embodiments only and is not intended to be limiting. As used herein, the singular forms “a,” “an,” and “the” may be intended to include the plural forms as well, unless the context clearly indicates otherwise. The terms “comprises,” “comprising,” “including,” and “having,” are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being “on,” “engaged to,” “connected to,” or “coupled to” another element or layer, it may be directly on, engaged, connected or coupled to the other element or layer, or intervening elements or layers may be present. In contrast, when an element is referred to as being “directly on,” “directly engaged to,” “directly connected to,” or “directly coupled to” another element or layer, there may be no intervening elements or layers present. Other words used to describe the relationship between elements should be interpreted in a like fashion (e.g., “between” versus “directly between,” “adjacent” versus “directly adjacent,” etc.). As used herein, the term “and/or” includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," "top", "bottom", and the like, may be used herein for ease of description to describe one element's or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptions used herein interpreted accordingly.

What is claimed is:

1. A memory apparatus, comprising:

memory cells each connected to one of a plurality of word lines and configured to retain a threshold voltage corresponding to one of a plurality of data states; and a control means configured to:

determine ones of the plurality of data states for memory cells of a neighboring word line of the plurality of word lines adjacent to a selected word line of the plurality of word lines in a pre-read, determine an adjusted sense time according to a first zone and a second zone of a plurality of zones identified for the memory cells of the neighboring word line adjacent each of the memory cells of the selected word line and the one of the plurality of data states targeted for the memory cells of the selected word line and a temperature of the memory apparatus, select a first zone sense coefficient and a first zone temperature coefficient and a second zone sense coefficient and a second zone temperature coefficient from a coefficient look up table based on the one of the plurality of data states targeted for the memory cells of the selected word line, calculate a first zone delta sense time using the first zone sense coefficient and the temperature of the memory apparatus and calculate a second zone delta sense time using the second zone sense coefficient and the temperature of the memory apparatus, determine the adjusted sense time for each one of the memory cells of the selected word line using the first zone delta sense time in response to the one of the plurality of zones identified being the first zone and determine the adjusted sense time for each one of the memory cells of the selected word line using the second zone delta sense time in response to the one of the plurality of zones identified being the second zone, and perform a plurality of reads on the selected word line for each of a plurality of groupings of ones of the plurality of data states in a read operation using the adjusted sense time determined for each of the memory cells of the selected word line.

2. The memory apparatus as set forth in claim 1, wherein the plurality of word lines and a plurality of dielectric layers extend horizontally and overlay one another in an alternating fashion in a stack, memory holes extend vertically through the stack, the memory cells are connected in series between a drain-side select gate transistor on a drain-side of each of the memory holes and a source-side select gate transistor on a source-side of each of the memory holes, the drain-side select gate transistor of each of the memory holes is connected to one of a plurality of bit lines and the source-side select gate transistor of each of the memory holes is connected to a source line, the neighboring word line is immediately adjacent to and disposed vertically above the selected word line in the stack.

3. The memory apparatus as set forth in claim 1, wherein the first zone corresponds with the memory cells of the neighboring word line having the threshold voltage associated with one group of the plurality of data states and the second zone corresponds with the memory cells of the neighboring word line having the threshold voltage associated with another group of the plurality of data states.

4. The memory apparatus as set forth in claim 3, wherein the memory apparatus further includes a temperature determination circuit configured to detect the temperature of the memory apparatus and the control means is further configured to:

determine the temperature of the memory apparatus using the temperature determination circuit;

calculate the first zone delta sense time as the first zone sense coefficient multiplied by a first zone sense temperature offset, the first zone sense temperature offset being equal to one plus the first zone temperature coefficient multiplied by a first temperature offset equal to the temperature of the memory apparatus minus eighty five; and calculate the second zone delta sense time as the second zone sense coefficient multiplied by a second zone sense temperature offset, the second zone sense temperature offset being equal to one plus the second zone temperature coefficient multiplied by a second temperature offset equal to the temperature of the memory apparatus minus eighty five.

5. The memory apparatus as set forth in claim 4, wherein data stored in the memory cells is stored as a plurality of lower bits of a lower page and a plurality of middle bits of a middle page and a plurality of upper bits of an upper page encoded with a code scheme, the plurality of data states includes, in order of the threshold voltage increasing in magnitude, an erased state and a first data state and a second data state and a third data state and a fourth data state and a fifth data state and a sixth data state and a seventh data state, the plurality of groupings of ones of the plurality of data states includes the lower page corresponding with the first data state and the fifth data state and the middle page corresponding with the second data state and the fourth data state and the sixth data state and the upper page corresponding with the third data state and the seventh data state, the first zone corresponds with the memory cells of the neighboring word line having the threshold voltage associated with the erased state and the first data state and the second data state and the third data state and the fourth data state, and the second zone corresponds with the memory cells of the neighboring word line having the threshold voltage associated with the fifth data state and the sixth data state and the seventh data state.

6. The memory apparatus as set forth in claim 3, wherein the control means is further configured to apply a single read voltage corresponding to one of the plurality of data states to the selected word line while the memory cells associated with the first zone and the memory cells associated with the second zone are read in turn using the adjusted sense time during the plurality of reads.

7. A controller in communication with a memory apparatus including memory cells each connected to one of a plurality of word lines and configured to retain a threshold voltage corresponding to one of a plurality of data states, the controller configured to:

instruct the memory apparatus to determine ones of the plurality of data states for memory cells of a neighboring word line of the plurality of word lines adjacent to a selected word line of the plurality of word lines in a pre-read;

instruct the memory apparatus to determine an adjusted sense time according to a first zone and a second zone of a plurality of zones identified for the memory cells of the neighboring word line adjacent each of the memory cells of the selected word line and the one of the plurality of data states targeted for the memory cells of the selected word line and a temperature of the memory apparatus;

instruct the memory apparatus to select a first zone sense coefficient and a first zone temperature coefficient and a second zone sense coefficient and a second zone temperature coefficient from a coefficient lookup table based on the one of the plurality of data states targeted for the memory cells of the selected word line, instruct the memory apparatus to calculate a first zone delta sense time using the first zone sense coefficient and the temperature of the memory apparatus and calculate a second zone delta sense time using the second zone sense coefficient and the temperature of the memory apparatus, instruct the memory apparatus to determine the adjusted sense time for each one of the memory cells of the selected word line using the first zone delta sense time in response to the one of the plurality of zones identified being the first zone and determine the adjusted sense time for each one of the memory cells of the selected word line using the second zone delta sense time in response to the one of the plurality of zones identified being the second zone, and instruct the memory apparatus to perform a plurality of reads on the selected word line for each of a plurality of groupings of ones of the plurality of data states in a read operation using the adjusted sense time determined for each of the memory cells of the selected word line.

8. The controller as set forth in claim 7, wherein the plurality of word lines and a plurality of dielectric layers extend horizontally and overlay one another in an alternating fashion in a stack, memory holes extend vertically through the stack, the memory cells are connected in series between a drain-side select gate transistor on a drain-side of each of the memory holes and a source-side select gate transistor on a source-side of each of the memory holes, the drain-side select gate transistor of each of the memory holes is connected to one of a plurality of bit lines and the source-side select gate transistor of each of the memory holes is connected to a source line, the neighboring word line is immediately adjacent to and disposed vertically above the selected word line in the stack.

9. The controller as set forth in claim 7, wherein the first zone corresponds with the memory cells of the neighboring word line having the threshold voltage associated with one group of the plurality of data states and the second zone corresponds with the memory cells of the neighboring word line having the threshold voltage associated with another group of the plurality of data states.

10. The controller as set forth in claim 9, wherein the memory apparatus further includes a temperature determination circuit configured to detect the temperature of the memory apparatus and the controller is further configured to:

instruct the memory apparatus to determine the temperature of the memory apparatus using the temperature determination circuit;

calculate the first zone delta sense time as the first zone sense coefficient multiplied by a first zone sense temperature offset, the first zone sense temperature offset being equal to one plus a first zone temperature coefficient multiplied by a first temperature offset equal to the temperature of the memory apparatus minus eighty five; and calculate the second zone delta sense time as the second zone sense coefficient multiplied by a second zone sense temperature offset, the second zone sense temperature offset being equal to one plus the second zone temperature coefficient multiplied by a second temperature offset equal to the temperature of the memory apparatus minus eighty five.

11. The controller as set forth in claim 10, wherein data stored in the memory cells is stored as a plurality of lower bits of a lower page and a plurality of middle bits of a middle page and a plurality of upper bits of an upper page encoded with a code scheme, the plurality of data states includes, in order of the threshold voltage increasing in magnitude, an erased state and a first data state and a second data state and a third data state and a fourth data state and a fifth data state and a sixth data state and a seventh data state, the plurality of groupings of ones of the plurality of data states includes the lower page corresponding with the first data state and the fifth data state and the middle page corresponding with the second data state and the fourth data state and the sixth data state and the upper page corresponding with the third data state and the seventh data state, the first zone corresponds with the memory cells of the neighboring word line having the threshold voltage associated with the erased state and the first data state and the second data state and the third data state and the fourth data state, and the second zone corresponds with the memory cells of the neighboring word line having the threshold voltage associated with the fifth data state and the sixth data state and the seventh data state.

12. A method of operating a memory apparatus including memory cells each connected to one of a plurality of word lines and configured to retain a threshold voltage corresponding to one of a plurality of data states, the method comprising:

determining ones of the plurality of data states for memory cells of a neighboring word line of the plurality of word lines adjacent to a selected word line of the plurality of word lines in a pre-read;

determining an adjusted sense time according to a first zone and a second zone of a plurality of zones identified for the memory cells of the neighboring word line adjacent each of the memory cells of the selected word line and the one of the plurality of data states targeted for the memory cells of the selected word line and a temperature of the memory apparatus;

selecting a first zone sense coefficient and a first zone temperature coefficient and a second zone sense coefficient and a second zone temperature coefficient from a coefficient look up table based on the one of the plurality of data states targeted for the memory cells of the selected word line;

calculating a first zone delta sense time using the first zone sense coefficient and the temperature of the memory apparatus and calculate a second zone delta sense time using the second zone sense coefficient and the temperature of the memory apparatus;

determining the adjusted sense time for each one of the memory cells of the selected word line using the first zone delta sense time in response to the one of the plurality of zones identified being the first zone and determine the adjusted sense time for each one of the memory cells of the selected word line using the second zone delta sense time in response to the one of the plurality of zones identified being the second zone; and performing a plurality of reads on the selected word line for each of a plurality of groupings of ones of the plurality of data states in a read operation using the adjusted sense time determined for each of the memory cells of the selected word line.

13. The method as set forth in claim 12, wherein the plurality of word lines and a plurality of dielectric layers extend horizontally and overlay one another in an alternating fashion in a stack, memory holes extend vertically through the stack, the memory cells are connected in series between a drain-side select gate transistor on a drain-side of each of the memory holes and a source-side select gate transistor on a source-side of each of the memory holes, the drain-side select gate transistor of each of the memory holes is connected to one of a plurality of bit lines and the source-side select gate transistor of each of the memory holes is connected to a source line, the neighboring word line is immediately adjacent to and disposed vertically above the selected word line in the stack.

14. The method as set forth in claim 12, wherein the first zone corresponds with the memory cells of the neighboring word line having the threshold voltage associated with one group of the plurality of data states and the second zone corresponds with the memory cells of the neighboring word line having the threshold voltage associated with another group of the plurality of data states.

15. The method as set forth in claim 14, wherein the memory apparatus further includes a temperature determination circuit configured to detect the temperature of the memory apparatus and the method further includes:

determining the temperature of the memory apparatus using the temperature determination circuit;

calculating the first zone delta sense time as the first zone sense coefficient multiplied by a first zone sense temperature offset, the first zone sense temperature offset being equal to one plus the first zone temperature coefficient multiplied by a first temperature offset equal to the temperature of the memory apparatus minus eighty five; and calculating the second zone delta sense time as the second zone sense coefficient multiplied by a second zone sense temperature offset, the second zone sense temperature offset being equal to one plus the second zone temperature coefficient multiplied by a second temperature offset equal to the temperature of the memory apparatus minus eighty five.

16. The method as set forth in claim 15, wherein data stored in the memory cells is stored as a plurality of lower bits of a lower page and a plurality of middle bits of a middle page and a plurality of upper bits of an upper page encoded with a code scheme, the plurality of data states includes, in order of the threshold voltage increasing in magnitude, an erased state and a first data state and a second data state and a third data state and a fourth data state and a fifth data state and a sixth data state and a seventh data state, the plurality of groupings of ones of the plurality of data states includes the lower page corresponding with the first data state and the fifth data state and the middle page corresponding with the second data state and the fourth data state and the sixth data state and the upper page corresponding with the third data state and the seventh data state, the first zone corresponds with the memory cells of the neighboring word line having the threshold voltage associated with the erased state and the first data state and the second data state and the third data state and the fourth data state, and the second zone corresponds with the memory cells of the neighboring word line having the threshold voltage associated with the fifth data state and the sixth data state and the seventh data state.

17. The method as set forth in claim 14, further including applying a single read voltage corresponding to one of the plurality of data states to the selected word line while the memory cells associated with the first zone and the memory cells associated with the second zone are read in turn using the adjusted sense time during the plurality of reads.

* * * * *